(12) United States Patent
Aoshima et al.

(10) Patent No.: US 11,921,459 B2
(45) Date of Patent: Mar. 5, 2024

(54) IMAGING SYSTEM WITH CLEANING OF FINE PARTICLE COLLECTION DEVICE

(71) Applicant: HEWLETT-PACKARD DEVELOPMENT COMPANY, L.P., Spring, TX (US)

(72) Inventors: Yuji Aoshima, Yokohama (JP); Takashi Nakazawa, Yokohama (JP); Takuya Ito, Yokohama (JP)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/908,656

(22) PCT Filed: Jan. 27, 2021

(86) PCT No.: PCT/US2021/015218
§ 371 (c)(1),
(2) Date: Sep. 1, 2022

(87) PCT Pub. No.: WO2021/178076
PCT Pub. Date: Sep. 10, 2021

(65) Prior Publication Data
US 2023/0103365 A1  Apr. 6, 2023

(30) Foreign Application Priority Data

Mar. 6, 2020 (JP) .................... 2020-038807

(51) Int. Cl.
*G03G 21/00* (2006.01)
*B01D 24/00* (2006.01)
(Continued)

(52) U.S. Cl.
CPC ....... *G03G 21/206* (2013.01); *B01D 24/4615* (2013.01); *B01D 24/4673* (2013.01);
(Continued)

(58) Field of Classification Search
CPC ......... G03G 21/206; G03G 2221/1645; H05K 7/20181; F24F 8/108; F24F 8/30; F24F 8/90; B07B 1/50; B07B 1/524; B01D 24/4615; B01D 24/4673; B01D 29/6407; B01D 29/6415; B01D 35/20
(Continued)

(56) References Cited

U.S. PATENT DOCUMENTS

2003/0142992 A1\* 7/2003 Johnson ............... G03G 21/206
399/99
2011/0211860 A1   9/2011 Shimoyama et al.
(Continued)

FOREIGN PATENT DOCUMENTS

JP   09-133651 A   5/1997
JP   10-010089 A   1/1998
(Continued)

*Primary Examiner* — Robert B Beatty
(74) *Attorney, Agent, or Firm* — Brooks, Cameron & Huebsch, PLLC

(57) ABSTRACT

An imaging system includes a housing to define a housing space, a collection device to collect fine particles in the housing space, a detection device to detect a collection performance of the collection device, and a cleaning device to clean the collection device.

17 Claims, 30 Drawing Sheets

(51) Int. Cl.
  *B01D 24/46* (2006.01)
  *B01D 29/64* (2006.01)
  *B01D 35/20* (2006.01)
  *F24F 8/00* (2021.01)
  *F24F 8/30* (2021.01)
  *F24F 8/90* (2021.01)
  *G03G 21/20* (2006.01)
  *H05K 7/00* (2006.01)
  *H05K 7/20* (2006.01)

(52) U.S. Cl.
  CPC ......... *B01D 29/6415* (2013.01); *B01D 35/20* (2013.01); *F24F 8/30* (2021.01); *F24F 8/90* (2021.01); *H05K 7/20181* (2013.01); *G03G 2221/1645* (2013.01)

(58) Field of Classification Search
  USPC ...................................... 399/92, 93
  See application file for complete search history.

(56) References Cited

U.S. PATENT DOCUMENTS

| | | |
|---|---|---|
| 2013/0183061 A1 | 7/2013 | Park et al. |
| 2013/0243471 A1* | 9/2013 | Ikeda ................ G03G 21/206 399/93 |
| 2015/0023686 A1* | 1/2015 | Mukataka ........... G03G 21/206 399/99 |
| 2015/0351288 A1* | 12/2015 | Fukuda ............. H05K 7/20181 361/679.48 |
| 2016/0282806 A1 | 9/2016 | Asaoka et al. |
| 2016/0282807 A1* | 9/2016 | Kinoshita ........... G03G 21/206 |
| 2016/0286669 A1 | 9/2016 | Narahashi et al. |
| 2019/0011879 A1 | 1/2019 | Miyazaki |
| 2020/0050144 A1 | 2/2020 | Kabata et al. |
| 2020/0326654 A1* | 10/2020 | Mizutani ................ G03G 21/10 |
| 2021/0271183 A1* | 9/2021 | Ono .......................... B03C 3/12 |

FOREIGN PATENT DOCUMENTS

| | | |
|---|---|---|
| JP | 2011-180236 A | 9/2011 |
| JP | 2012-128013 A | 7/2012 |
| JP | 2015-141392 A | 8/2015 |
| JP | 2019-015858 A | 1/2019 |

* cited by examiner

IMAGING SYSTEM WITH CLEANING OF FINE PARTICLE COLLECTION DEVICE

CROSS REFERENCE TO RELATED APPLICATIONS

This application is a U.S. National Stage Application which claims the benefit under 35 U.S.C. § 371 of International Patent Application No. PCT/US2021/015218 filed on Jan. 27, 2021, which claims the priority benefit of Japanese Patent Application No. 2020-038807 filed on Mar. 6, 2020, the contents of each of which are incorporated herein by reference.

BACKGROUND

Printers include a belt that conveys a printing sheet, a photoreceptor drum on which an electrostatic latent image is formed, a development device that develops the electrostatic latent image into a toner image, a transfer device that transfers the toner image to the printing sheet, a fixing device that fixes the toner image to the printing sheet, and an ejection device that ejects the printing sheet.

DETAILED DESCRIPTION

In the following description, with reference to the drawings, the same reference numbers are assigned to the same components or to similar components having the same function, and overlapping description is omitted.

Figure 1:
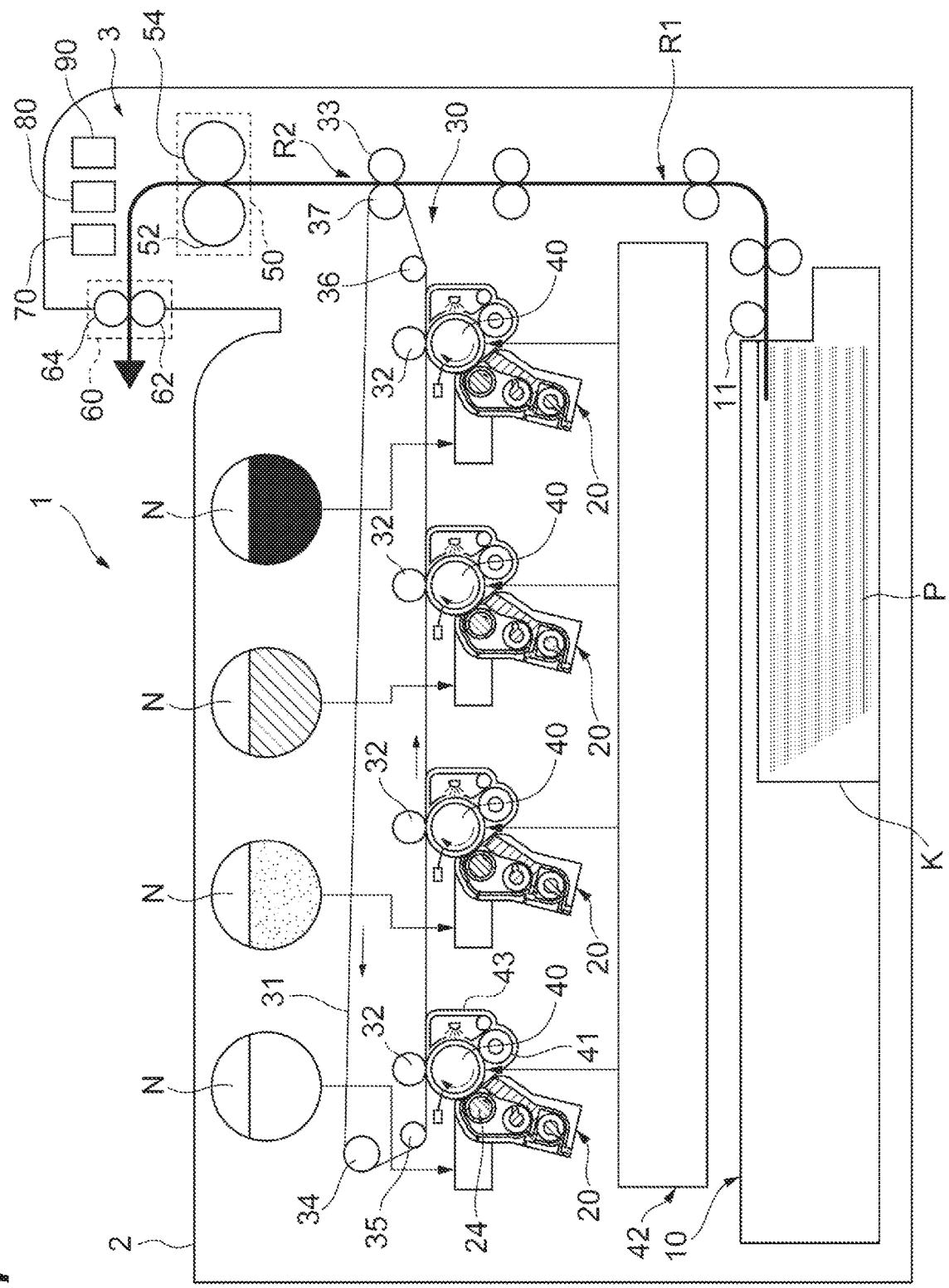
FIG. 1 is a schematic view of an example imaging apparatus.

With reference to FIG. 1, an example imaging apparatus 1 may form a color image with toners of four colors of magenta, yellow, cyan, and black. The example imaging apparatus 1 may include a conveyance device 10 that may convey paper P which may be a recording medium, an image carrier 40 (e.g., a photoreceptor drum) having a surface (e.g., a peripheral surface) on which an electrostatic latent image may be formed, a development device 20 that develops the electrostatic latent image into a toner image, a transfer device 30 that secondarily transfers the toner image to the paper P, a fixing device 50 that fixes the toner image to the paper P, and an ejection device 60 that ejects the paper P.

The conveyance device 10 may convey the paper P, on which an image may be to be formed, on a conveyance route R1. The paper P to be conveyed may be stacked and accommodated in a cassette K, and may be picked up by a paper feeding roller 11. The conveyance device 10 may cause the paper P to reach a transfer nip region R2 through the conveyance route R1 at a time when the toner image to be transferred reaches the transfer nip region R2.

Four development devices 20 are provided corresponding to four respective colors of magenta, yellow, cyan, and black. Each of the development devices 20 may include a development roller 24 that transfers a toner to the image carrier 40. In the development device 20, a two-component developer, including a toner and a carrier, may be used as a developer, for example. For example, the toner and the carrier are adjusted to a target mixing ratio, and are mixed and stirred in the development device 20. Accordingly, the toner may be dispersed to achieve a developer to which an optimal or target charging amount may be applied. The developer may be carried on the development roller 24. The development roller 24 rotates to convey the developer to a region that faces the image carrier 40, where the toner in the developer may be transferred to an electrostatic latent image formed on the peripheral surface of the image carrier 40, so as to develop the electrostatic latent image.

The transfer device 30 may convey the toner image formed by each of the development devices 20 to a transfer nip region R2 where the toner image may be secondarily transferred to the paper P. The transfer device 30 may include a transfer belt 31 to which the toner image from the image carrier 40 may be primarily transferred. The transfer device 30 also may include suspension rollers 34, 35, 36, and 37 which suspend (or support) the transfer belt 31, four primary transfer rollers 32 adjacent the respective four image carriers 40 to position the transfer belt 31 between each primary transfer roller 32 and the associated image carrier 40, and a secondary transfer roller 33 located adjacent the suspension roller 37 to position the transfer belt 31 between the secondary transfer roller 33 and the suspension roller 37.

The transfer belt 31 may be an endless belt that may be driven to rotate by the suspension rollers 34, 35, 36, and 37. The suspension rollers 34, 35, 36, and 37 are rollers capable of rotating around respective axes. The suspension roller 37 may be a drive roller, and the suspension rollers 34, 35, and 36 are driven rollers which are driven to rotate via the rotation of the suspension roller 37. The primary transfer roller 32 may be provided to press toward the image carrier 40 from an inner peripheral side of the transfer belt 31. The secondary transfer roller 33 may be disposed parallel to the suspension roller 37 with the transfer belt 31 interposed therebetween. The secondary transfer roller 33 may be provided to press toward the suspension roller 37 from an outer peripheral side of the transfer belt 31. Accordingly, the secondary transfer roller 33 forms the transfer nip region R2 between the secondary transfer roller 33 and the transfer belt 31.

The image carrier 40 may also be referred to as an electrostatic latent image carrier, a photoreceptor drum, or the like. Four image carriers 40 are provided corresponding to the four respective colors of magenta, yellow, cyan, and black. The image carriers 40 are spaced apart along a movement direction of the transfer belt 31. The development device 20, a charging roller 41, and a cleaning unit (or cleaning device) 43 are provided around each of the image carriers 40. Accordingly, in addition to the four development devices 20, the example imaging apparatus 1 may include four charging rollers 41 and four cleaning units 43. In addition, an exposure unit (or exposure device) 42 may be provided adjacent the four development devices 20.

For each of image carriers 40, the charging roller 41 may be a charging unit (or charging device) that charges a surface of the image carrier 40 to a predetermined potential. The charging roller 41 rotates with a rotation of the image carrier 40. The exposure unit 42 exposes the surface of the image carrier 40 charged by the charging roller 41 in association with an image to be formed on the paper P. Accordingly, a potential of a portion of the surface of the image carrier 40 that may be exposed by the exposure unit 42 changes, and thereby, an electrostatic latent image may be formed on the surface of the image carrier 40. Each of the four development devices 20 develops the electrostatic latent image formed on the corresponding image carrier 40 by a toner supplied from a toner tank N facing the development device 20, to generate a toner image. Accordingly, the imaging apparatus 1 may include for four toner tanks N that are respectively filled with toners (or toner particles) of magenta, yellow, cyan, and black, and carriers (or carrier particles) corresponding to the amounts of toners filled. For each of the image carriers 40, after the toner image formed on the image carrier 40 may be primarily transferred to the transfer belt 31, the corresponding cleaning unit 43 recovers toner that remains on the image carrier 40.

The fixing device 50 may convey the paper P to pass through a fixing nip region in which the paper P may be heated and pressed, thereby fixing the toner image to the paper P. The fixing device 50 may include a heating roller 52 that heats the paper P and a pressing roller 54 that presses and rotates the heating roller 52. The heating roller 52 and the pressing roller 54 are formed in a cylindrical shape, and a heat source such as a halogen lamp may be provided inside the heating roller 52. The fixing nip region may be a contact region formed between the heating roller 52 and the pressing roller 54, and the paper P may be conveyed to pass through the fixing nip region to melt and fix the toner image to the paper P.

The ejection device 60 may include ejection rollers 62 and 64 for ejecting the paper P having the fixed toner image, to the outside of the apparatus.

An example print process carried out by the imaging apparatus 1 will be described. When an image signal of an image to be printed may be input to the imaging apparatus 1, a control unit (or controller) of the imaging apparatus 1 controls the paper feeding roller 11 to rotate so as to pick up and convey the paper P stacked in the cassette K. In a charging operation, a surface of the image carrier 40 may be charged to a predetermined potential by the charging roller 41. In an exposure process, the exposure unit 42 irradiates the surface of the image carrier 40 with laser light based on the image signal received so as to form an electrostatic latent image on the surface of the image carrier 40.

In a development operation, the development device 20 develops the electrostatic latent image, to form a toner image. The toner image formed in this manner may be primarily transferred from the image carrier 40 to the transfer belt 31 at a region where the image carrier 40 faces the transfer belt 31. Toner images formed on the four image carriers 40 are sequentially layered on the transfer belt 31, and a single composite toner image may be formed. The composite toner image may be secondarily transferred to the paper P that may be conveyed to a transfer nip region R2 where the suspension roller 37 faces the secondary transfer roller 33.

The paper P with the composite toner image may be conveyed to the fixing device 50. In a fixing operation, the fixing device 50 heats and presses the paper P between the heating roller 52 and the pressing roller 54 when the paper P passes through the fixing nip region to melt and fix the composite toner image to the paper P. The ejection rollers 62 and 64 then eject the paper P to the outside of the imaging apparatus 1.

Figure 2:
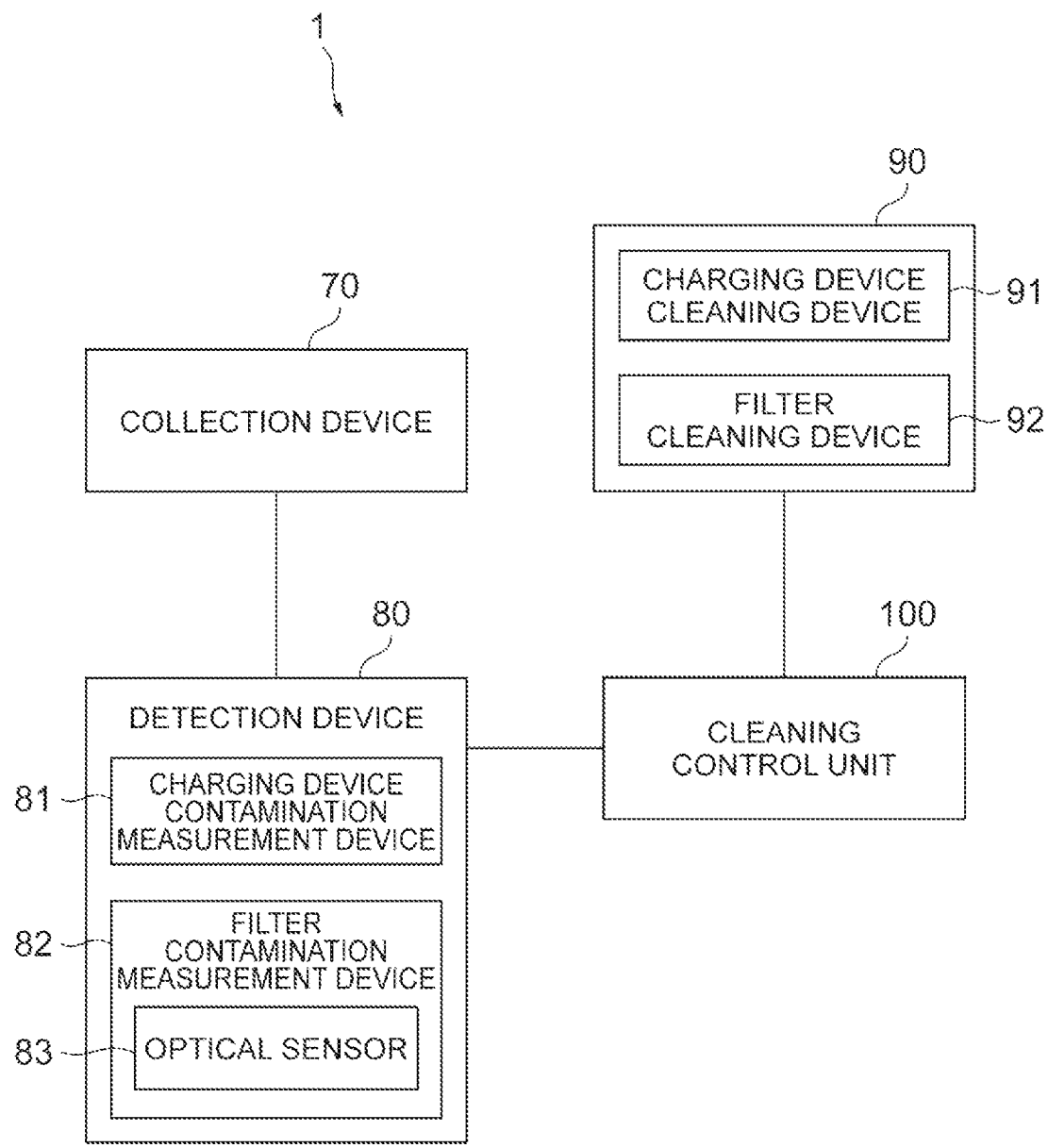
FIG. 2 is a block diagram illustrating components of an example imaging apparatus.

FIG. 2 is a block diagram illustrating a part of a functional configuration of an example of the imaging apparatus 1. The imaging apparatus 1 illustrated in FIGS. 1 and 2 may include a collection device 70, a cleaning device 90, and a cleaning control unit (or cleaning controller) 100. The imaging apparatus 1 illustrated in FIGS. 1 and 2 may also include a detection device 80.

Figure 3:
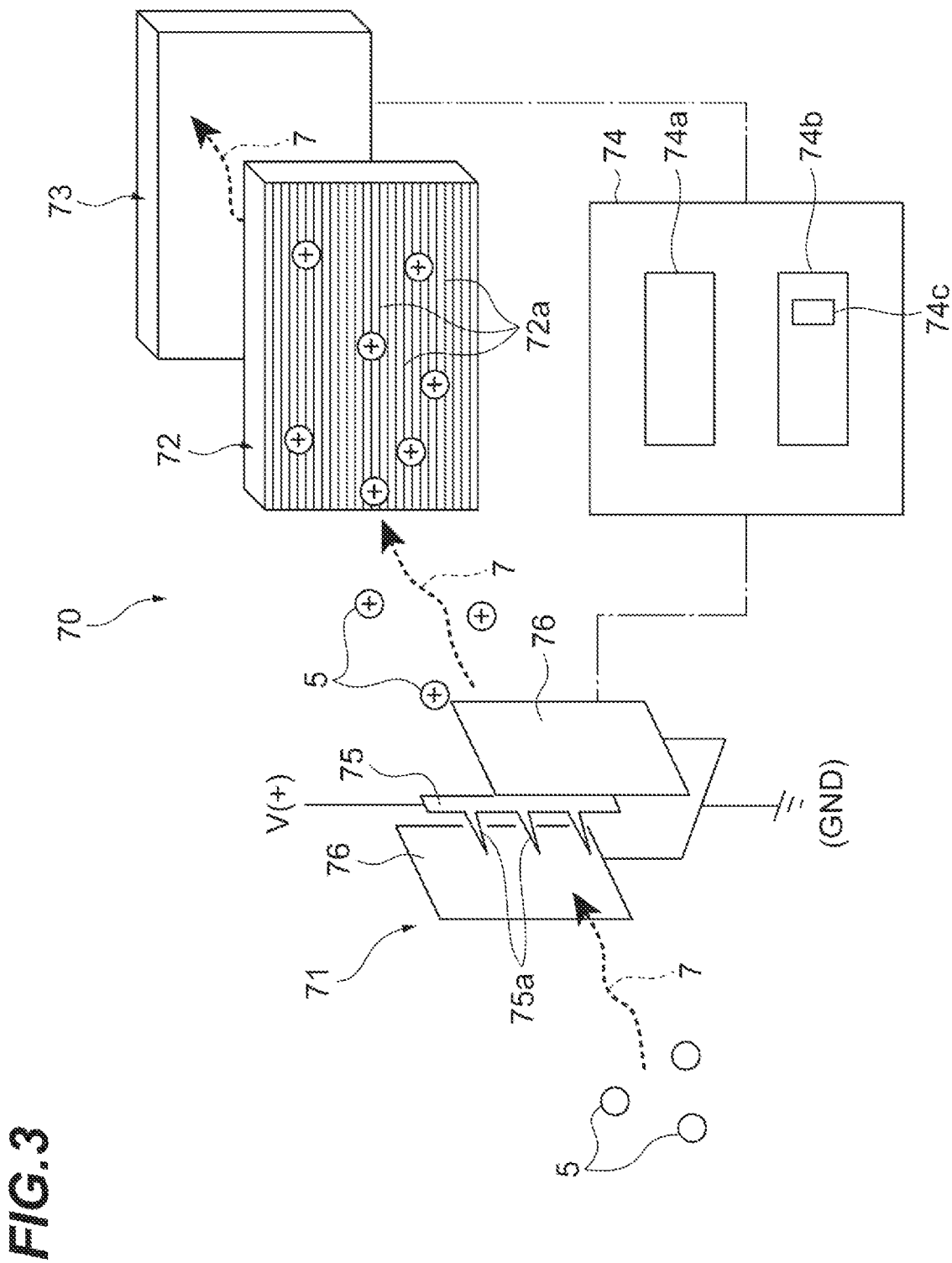
FIG. 3 is a diagram illustrating an example collection device for an imaging apparatus.
Figure 4:
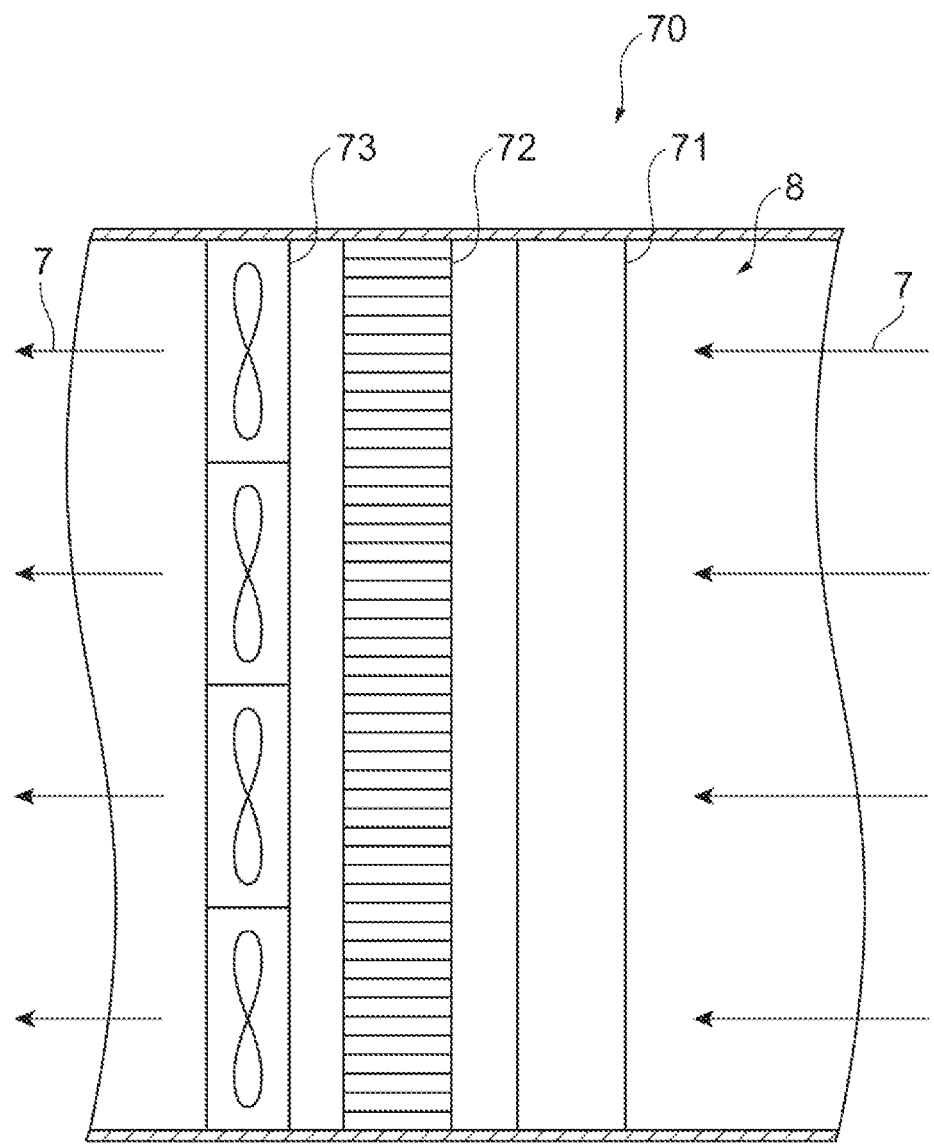
FIG. 4 is a schematic diagram illustrating a cross-section of an example collection device.

With reference to FIGS. 1, 3, and 4, for example, the collection device 70 may be disposed in the vicinity of the fixing device 50 in a housing space 3 that may be defined by a housing 2 of the imaging apparatus 1, and collects fine particles 5 floating in the housing space 3. The fine particles 5 may include for example, particles having a size of approximately 50 nm to 300 nm, which are ultrafine particles (UFP). For example, the fine particles 5 can be generated from a toner that may be heated by the fixing device 50, paper, constituent parts of the fixing device 50, or other peripheral parts. The collection device 70 may be disposed at a position adjacent to the fixing device 50 in which the amount of the fine particles 5 generated may be relatively high, to more effectively collect the fine particles 5.

The example collection device 70 may be an electrostatic dust collection device including a charging device (or charger) 71, a filter 72, a fan 73, and a control unit (or controller, or collection-device controller) 74. For example, the charging device 71 may be an ionizer including a first electrode (discharge electrode) 75 and a pair of second electrodes (counter electrodes) 76. The first electrode 75 and the second electrodes 76 may be formed from stainless steel, for example.

A high voltage may be applied to the first electrode 75 by a high-voltage power supply. The first electrode 75 may include a plurality of protrusions 75a for performing discharge. The plurality of protrusions 75a may be spaced apart at regular intervals (e.g., regular distances). The protrusions 75a may be formed in a saw blade shape or a needle shape. The pair of second electrodes 76 are grounded, and are disposed to face each other. The first electrode 75 may be disposed between the pair of second electrodes 76. The configuration of the charging device 71 is not limited to the example in FIG. 3 and can be modified suitably.

In the charging device 71, when a voltage applied to the first electrode 75 may be less than a predetermined value (e.g., a threshold value), no current flows between the first electrode 75 and the second electrodes 76. When the voltage applied to the first electrode 75 may be equal to or greater than the predetermined value, a discharge phenomenon occurs, and a current flows between the first electrode 75 and the second electrodes 76. The charging device 71 charges with the current, fine particles 5 which pass through the first electrode 75 and the second electrodes 76. The greater the voltage that may be applied to the first electrode 75 is, the more the current (the amount of energization) flowing between the first electrode 75 and the second electrodes 76 increases.

The control unit 74 controls the charging device 71. The control unit 74 controls, for example, the magnitude of the voltage applied to the first electrode 75. In some examples, the control unit 74 may control a high-voltage power supply to perform constant current control, by which the control unit 74 controls the magnitude of the voltage that may be applied to the first electrode 75 so that the amount of current flowing between the first electrode 75 and the second electrodes 76 reaches a predetermined target value. In some examples, the control unit 74 may control the magnitude of the voltage that may be applied to the first electrode 75 by varying a duty ratio of a Pulse Width Modulation (PWM) signal that may be input to the high-voltage power supply.

In the charging device 71, a tip end portion of the first electrode 75 may deteriorate over time with usage. When the tip end portion deteriorates, even when the amount of voltage applied may be constant, the current (e.g., an amount of current) flowing between the first electrode 75 and the second electrodes 76 may vary. The constant current control may be carried out, to adjust the amount of current to a target value to be stable, even when the tip end portion deteriorates.

The filter 72 may be a stacked body of a polymer sheet subject to an electret treatment, and may include a plurality of ventilation paths 72a formed in a tubular shape. A surface of the filter 72 may be semi-permanently charged. As a result, the filter 72 can collect the fine particles 5 charged by the charging device 71. For example, the filter 72 can collect the fine particles 5 due to a Coulomb force even when the filter 72 may be coarse.

The electret treatment is a treatment in which a polymer material is heated to melt, and solidified while applying a high voltage thereto so that the polymer material has a structure that retains charge. According to examples, the filter 72 may have a layer structure as illustrated in FIG. 3, a honeycomb structure, or a corrugated structure.

The fan 73 may include an air stream generating unit (or device) that generates an air stream 7 for carrying the fine particles 5. For example, the fan 73 enables air circulation with the outside of the housing 2, and may be disposed on an inner side of an opening formed in the housing 2. The charging device 71 and the filter 72 may be disposed between the fan 73 and the fixing device 50. The filter 72 may be disposed between the fan 73 and the charging device 71. The fan 73 generates an air stream 7 to carry the fine particles 5 charged by the charging device 71, to the filter 72. An air flow passage 8 through which the air stream 7 flows may be formed in the housing space 3. The air flow passage 8 may be a route or path for discharging air inside the housing space 3 to the outside of the housing 2 and for carrying the fine particles 5 floating in the housing space 3 to the filter 72. The charging device 71, the filter 72, and the fan 73 are arranged (e.g., aligned) along the air flow passage 8.

The control unit (or collection-device controller) 74 may be electrically connected to the charging device (or charger) 71, and controls an operation of the charging device 71. For example, the control unit 74 may control the operation of the fan 73 while controlling the magnitude of a voltage applied to the first electrode 75. In some examples, the control unit 74 may include a computer including a processor 74a such as a central processing unit (CPU), and a storage unit (or storage device) 74b such as a read-only memory (ROM) or a random access memory (RAM). The control unit 74 may be a control unit of the imaging apparatus 1 for performing the above-described print process.

The storage unit 74b may be a non-transitory computer-readable storage device (storage medium). In some example, the control unit 74 may include data and instructions 74c that may be read and executed by the processor 74a, to control a current supplied to the charging device 71.

Figure 5:
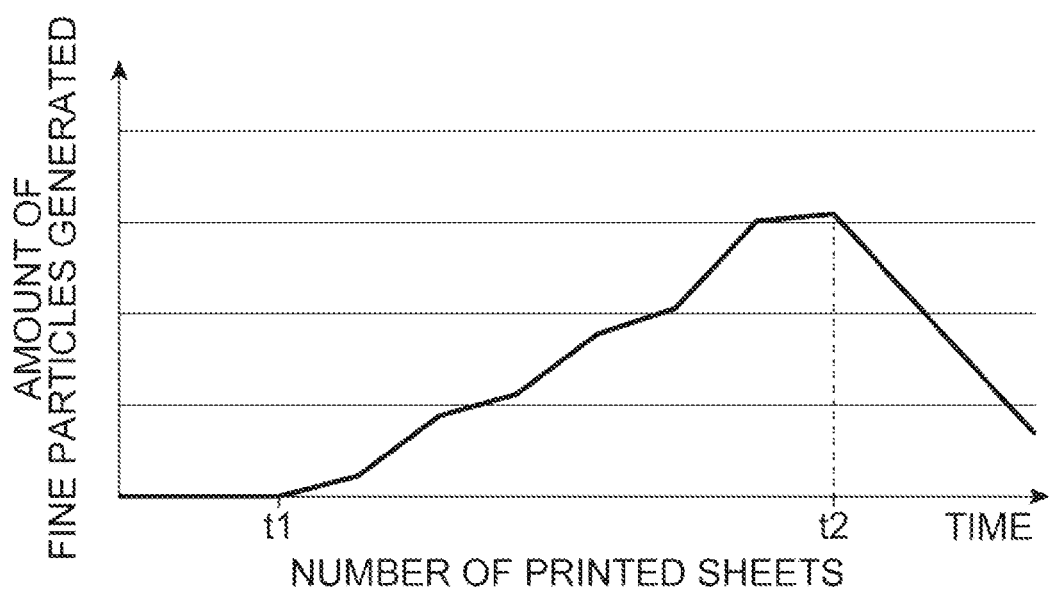
FIG. 5 is a graph of an amount of generated fine particles relative to a number of printed sheets over time, in an example imaging apparatus.

FIG. 5 is a graph schematically showing a relationship between the number of printed sheets of the paper P by the imaging apparatus 1, and the amount of the fine particles 5 generated inside the imaging apparatus 1, according to an example. As shown in FIG. 5, the amount of the fine particles 5 generated increases with an increase in the number of printed sheets in the imaging apparatus 1. The fine particles 5 are generated following a duration of a given time t1 after print initiation. When the given time t1 has passed, the amount of the fine particles 5 generated gradually increases, and upon reaching a print termination time t2, the amount of the fine particles 5 generated gradually decreases. After print termination, a plurality of the fine particles 5 aggregate or the fine particles 5 may adhere for example, to a wall or the like, and thus the amount of the fine particles 5 gradually decreases.

The detection device 80 detects collection performance (or collection performance information) of the collection device 70. The collection performance of the collection device 70 may include, for example, a collection rate of the fine particles 5 capable of being collected by the collection device 70. For example, the collection rate of the fine particles 5 may be a ratio of the amount of the fine particles 5 collected by the collection device 70 to the amount of the fine particles 5 generated as shown in FIG. 5.

As illustrated in FIG. 2, the detection device 80 may include a charging-device soiling measurement device (or charger soiling measurement device) 81 and a filter soiling measurement device 82.

The charging-device soiling measurement device 81 measures soiling of the charging device 71 as the collection performance information of the collection device 70. For example, the charging-device soiling measurement device 81 measures soiling formed on the charging device 71 to determine the collection performance based on an amount of soiling measured.

The charging device 71 has electric characteristics which vary due to soiling of the charging device 71, and the collection performance of the collection device 70 varies in accordance with the electric characteristics. For example, when a large amount of foreign matters such as the fine particles 5 and a toner adhere to the charging device 71, thereby soiling the charging device 71, discharge characteristics between the first electrode 75 and the second electrodes 76 deteriorate, and consequently, the collection performance of the collection device 70 decreases. Accordingly, the collection performance of the collection device 70 correlates with the soiling of the charging device 71, and the soiling of the charging device 71 may be expressed as a function of the collection performance of the collection device 70.

The charging-device soiling measurement device 81 measures the soiling of the charging device 71, for example, by monitoring the magnitude of a voltage that may be applied to the first electrode 75 through constant current control by the control unit 74. In this case, for example, it can be determined that the greater a variation amount of the voltage that may be applied to the first electrode 75 is, the greater the soiling of the charging device 71 is.

In some examples, the filter soiling measurement device 82 measures soiling formed on the filter 72 as the collection performance (or collection performance information) of the collection device 70. For example, the filter soiling measurement device 82 may measure the soiling of the filter 72 to determine the collection performance based on the soiling measured. For example, the filter soiling measurement device 82 may include an optical sensor 83 that detects light reflected from the filter 72 to measure the soiling of the filter 72. In some examples, the optical sensor 83 may include a light-receiving element that receives the light reflected and outputs a photocurrent corresponding to an intensity of the light received. The optical sensor 83 may include a light-emitting element that emits light. In addition, the optical sensor 83 may be disposed adjacent to the air flow passage 8, receives reflected light from the filter 72, and outputs an electric signal in correspondence with the received light intensity. As the optical sensor 83, for example, a commercially available optical reflection type sensor can be used.

Figure 6:
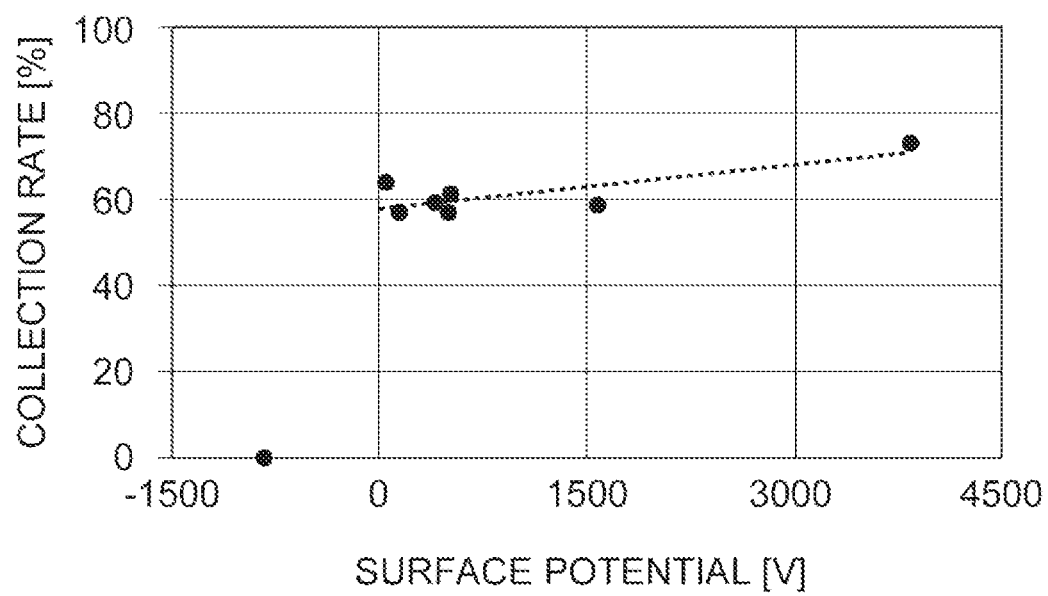
FIG. 6 is a graph of a collection rate relative to a surface potential in a filter of an example collection device.
Figure 7:
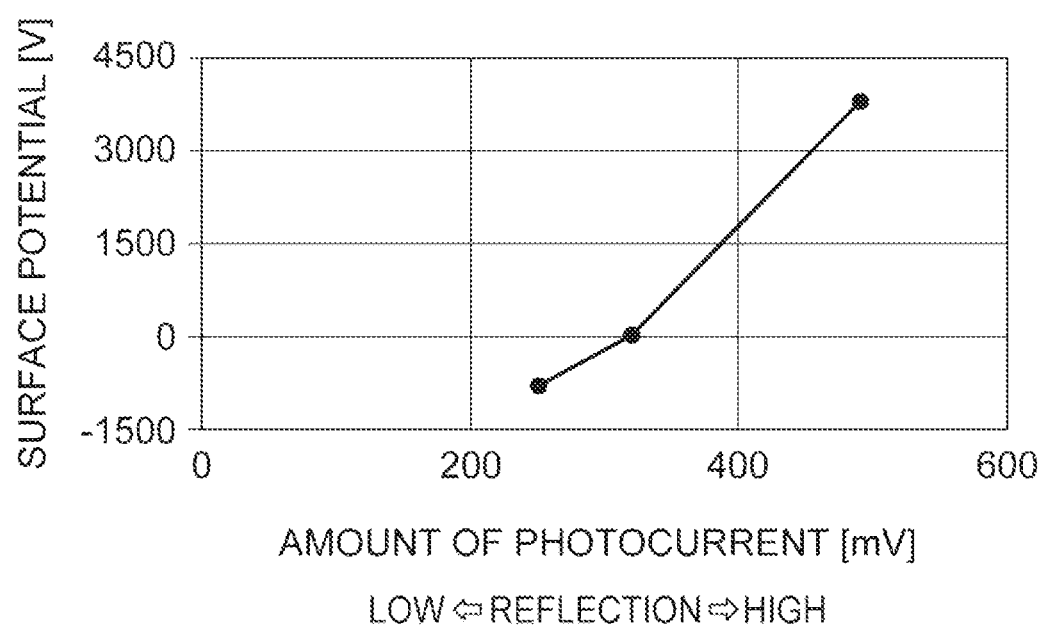
FIG. 7 is a graph of a surface potential of the filter relative to an amount of photocurrent output by a sensor, according to an example.

FIG. 6 is a graph showing an example of a relationship between a surface potential of the filter 72 and a collection rate of the fine particles 5 by the filter 72. FIG. 7 is a graph showing an example of a relationship between the surface potential of the filter 72 and intensity of light reflected from the filter 72. In FIGS. 6 and 7, a negative surface potential represents a state in which the filter 72 may be soiled due to sudden toner scattering. In FIG. 7, the intensity of light reflected from the filter 72 may be represented by an amount of photocurrent output by the optical sensor 83. As shown in FIG. 6, the surface potential of the filter 72 and the collection rate of the filter 72 have a correlation indicating that when the surface potential of the filter 72 decreases, the collection rate decreases. In addition, as shown in FIG. 7, the surface potential of the filter 72 and the intensity of the light reflected from the filter 72 have a correlation indicating that when the surface potential of the filter 72 decreases, the intensity of the light reflected from the filter 72 decreases. In addition, when a large amount of foreign matters such as the fine particles 5 and toner adhere to the filter 72, thereby soiling the filter 72, the surface potential of the filter 72 decreases, and the collection performance of the collection device 70 decreases. Accordingly, the soiling of the filter 72 and the collection performance of the collection device 70 have a correlation, and thus the soiling of the filter 72 may be expressed as a function of the collection performance of the collection device 70.

In some examples, the filter soiling measurement device 82 detects light reflected from the filter 72 via the optical sensor 83 to measure soiling of the filter 72, in order to determine the collection performance of the collection device 70. In this case, it can be determined for example, that the amount of photocurrent received by the optical sensor 83 (e.g., the light reflected from the filter 72) tends to decrease as the soiling of the filter 72 increases.

Figure 8:
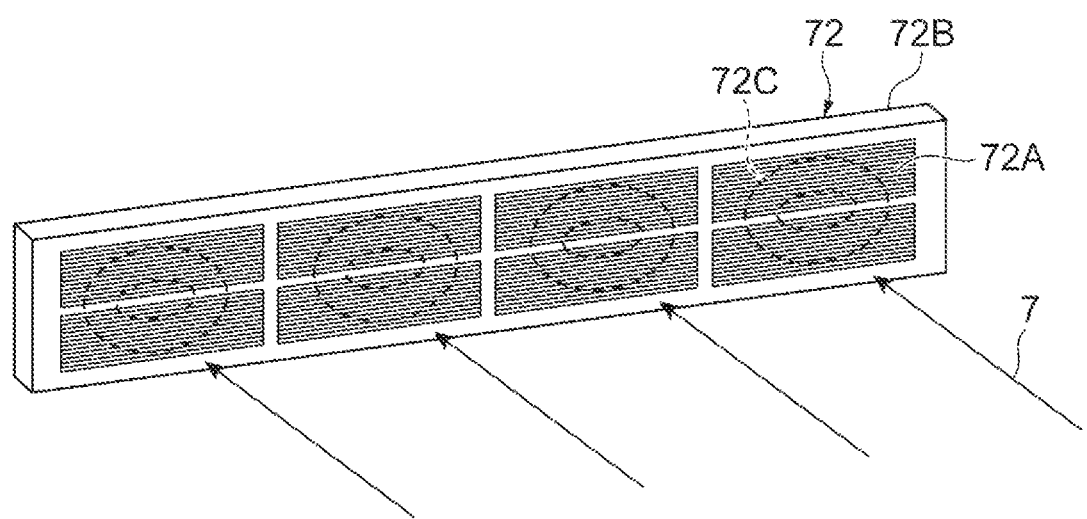
FIG. 8 is a schematic front perspective view of an example filter of a collection device.
Figure 9:
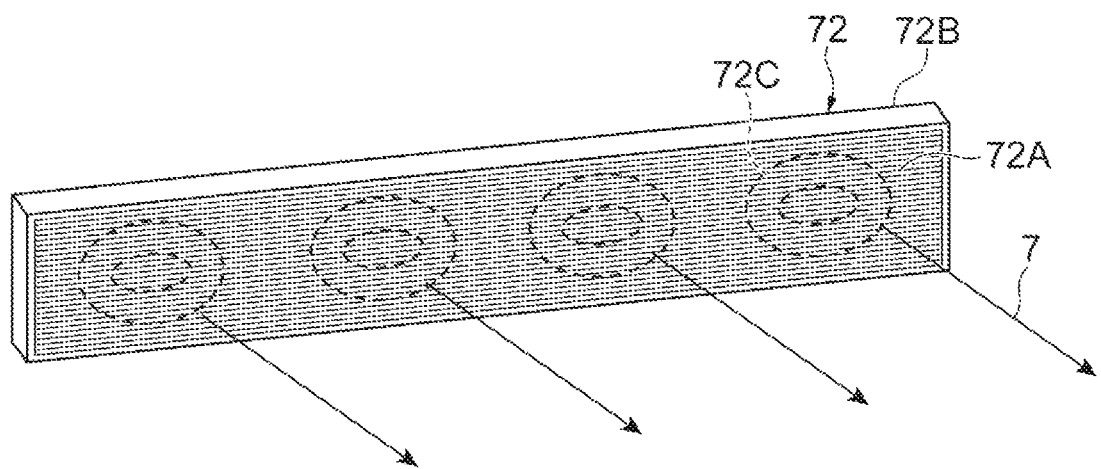
FIG. 9 is a schematic rear perspective view of the example filter.
Figure 10:
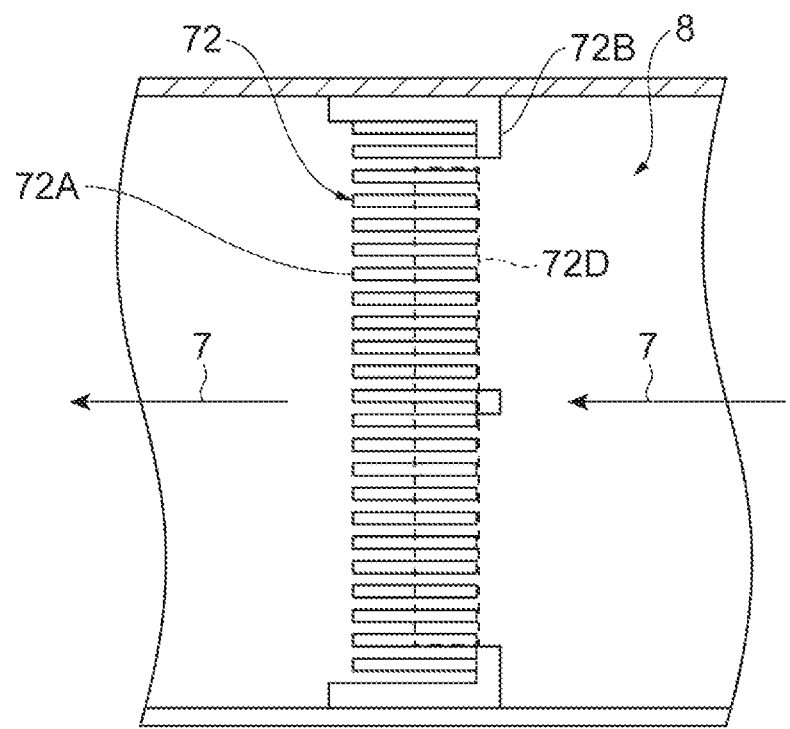
FIG. 10 is a schematic diagram illustrating a cross-section of the example filter.

The filter 72 illustrated in FIGS. 8 to 10 may include a filter main body 72A, and a frame 72B that holds the filter main body 72A. An external shape of the filter main body 72A may be a rectangular plate shape. The frame 72B may substantially conform to an outer shape of the filter main body 72A, and may cover a part of the filter main body 72A, on an upstream side in a direction of the air stream 7.

As described above, in the air flow passage 8, the air stream 7 may be generated by the fan 73, and foreign matters such as the fine particles 5 are carried with the air stream 7. Accordingly, in the filter main body 72A, a portion 72C of the filter main body 72A which may be aligned with the fan 73 (e.g., to face the fan 73) tends to become more soiled in comparison to a portion of the filter main body 72A which does not face (e.g., is offset from) the fan 73. In addition, in the filter main body 72A, a portion 72D of the filter main body 72A on an upstream side in the direction of the air stream 7 tends to become more soiled in comparison to a portion of the filter main body 72A on a downstream side in the direction of the air stream 7.

Figure 11:
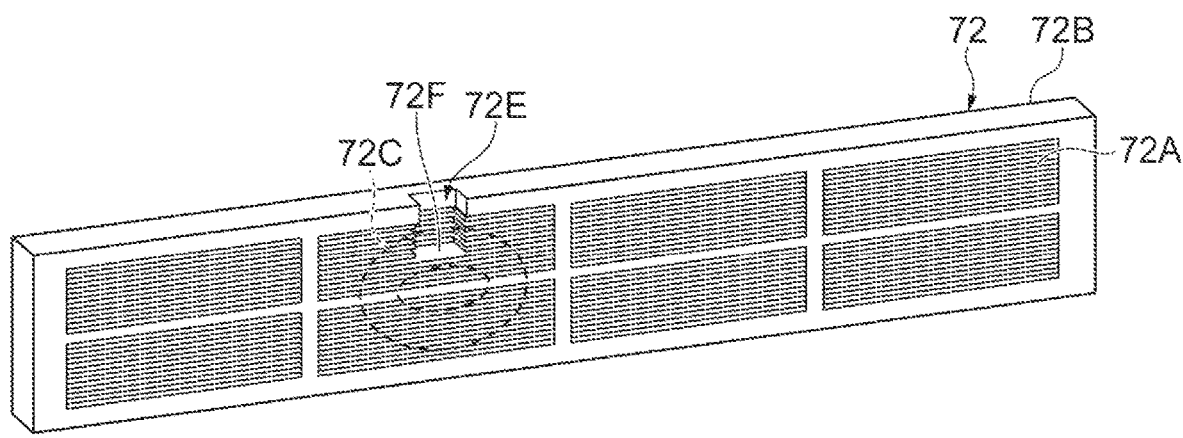
FIG. 11 is a schematic perspective view of an example filter of a collection device for filter soiling measurement.
Figure 12:
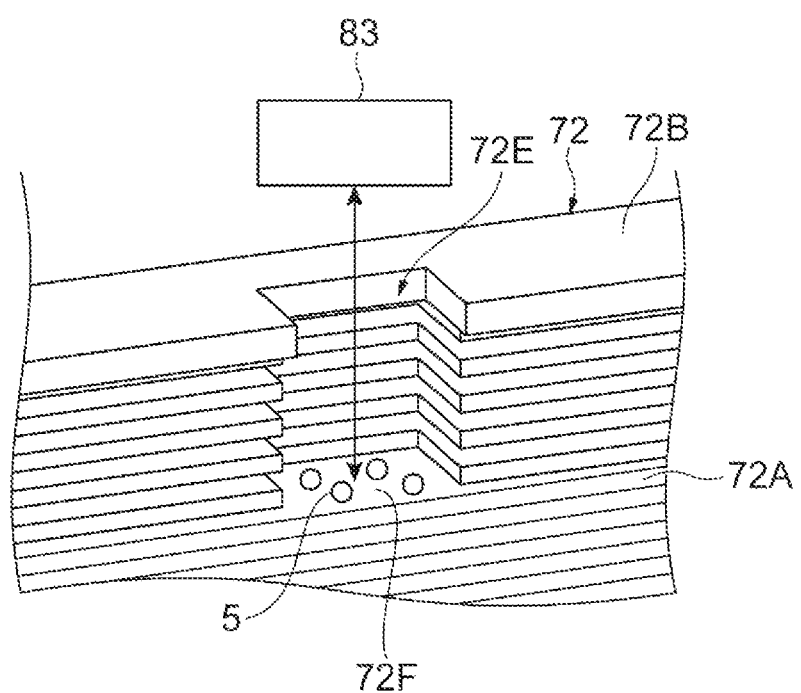
FIG. 12 is a schematic enlarged perspective view of a portion of the example filter illustrated in FIG. 11.

In an example illustrated in FIGS. 11 and 12, a recess 72E may be formed in the filter 72, so as to reach the portion 72C of the filter main body 72A which may be aligned with the fan 73 (e.g., to face the fan 73), and a detection surface 72F may be formed in the recess 72E. The recess 72E forms an optical route (or an optical path) for receiving reflected light from the detection surface 72F by the optical sensor 83. The recess 72E extends in the direction of the air stream 7 (direction of the air flow passage 8) from the upstream side in the direction of the air stream 7 toward a central portion of the filter 72 (e.g., a central portion in a thickness direction of the filter 72), and additionally extends in a direction orthogonal to the direction of the air stream 7 (direction of the air flow passage 8) along the optical path between the optical sensor 83 side and the central portion of the filter 72. The detection surface 72F of the filter main body 72A forms a detection target of the optical sensor 83. The detection surface 72F may be located at any suitable position of the air flow passage 8, for example, within the portion 72C of the filter main body 72A which may be aligned to face the fan 73.

Figure 13:
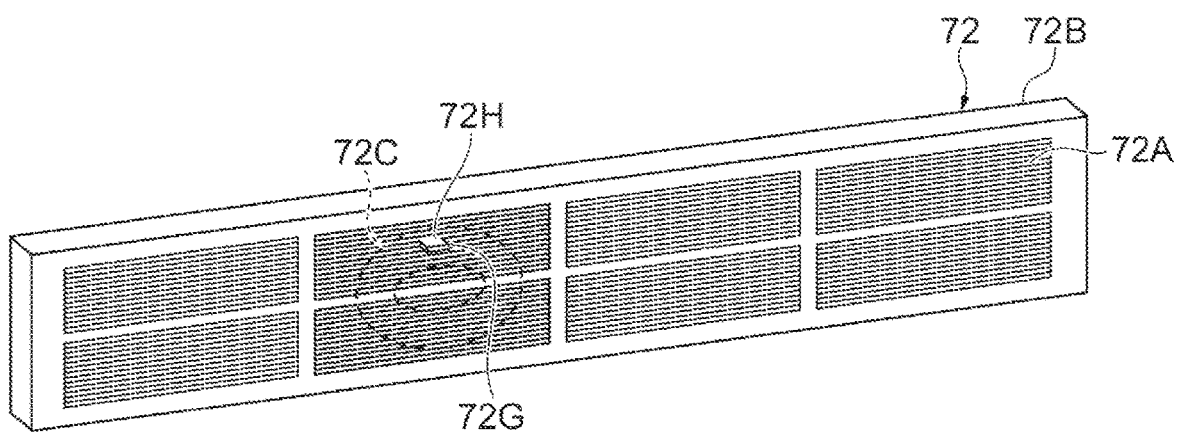
FIG. 13 is a schematic perspective view illustrating another example filter of a collection device for filter soiling measurement.
Figure 14:
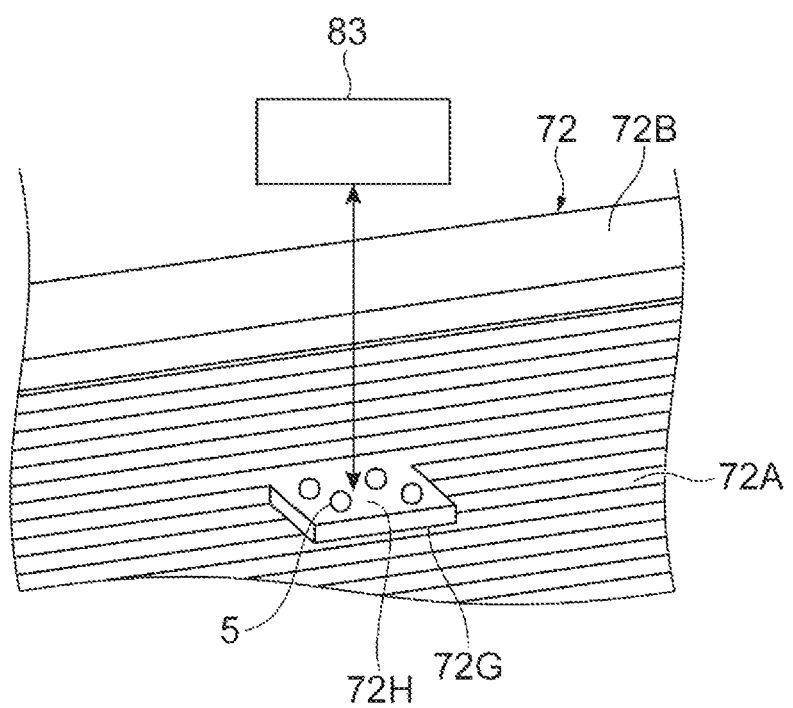
FIG. 14 is a schematic enlarged perspective view of a portion of the filter illustrated in FIG. 13, according to an example.

In an example illustrated in FIGS. 13 and 14, a protrusion 72G may be formed in the filter 72 so as to protrude from a filter main body 72A, to an upstream side in the direction of the air stream 7, and a detection surface 72H may be formed on the protrusion 72G. The protrusion 72G extends to the upstream side in the direction of the air stream 7 in comparison to a main portion (e.g., the filter main body 72A) of the filter 72. The detection surface 72H of the filter main body 72A forms a detection target for the optical sensor 83. The detection surface 72H may be located at any suitable position of the air flow passage 8, and may be located, for example, at the portion 72C of the filter main body 72A which may be aligned to face the fan 73.

Referring back to FIG. 2, the cleaning device 90 may be configured to clean the collection device 70. The cleaning device 90 may clean the collection device 70 through drive control by a cleaning control unit (or cleaning controller) 100 based on the collection performance measured by the detection device 80.

In some examples, the cleaning device 90 may include a charging-device cleaning device (or charger cleaning device) 91 and a filter cleaning device 92.

The charging-device cleaning device 91 may be configured to clean the charging device 71. According to some examples, the charging-device cleaning device 91 may clean the charging device 71 by applying vibration, shock, ultrasonic waves, shock waves, and the like to the charging device 71. In other examples, the charging-device cleaning device 91 may carry out a physical (or mechanical) removal such as brushing (e.g., removal with a brush). In yet other examples, the charging-device cleaning device 91 may apply a reverse voltage or pulse to the charging device 71.

Figure 15:
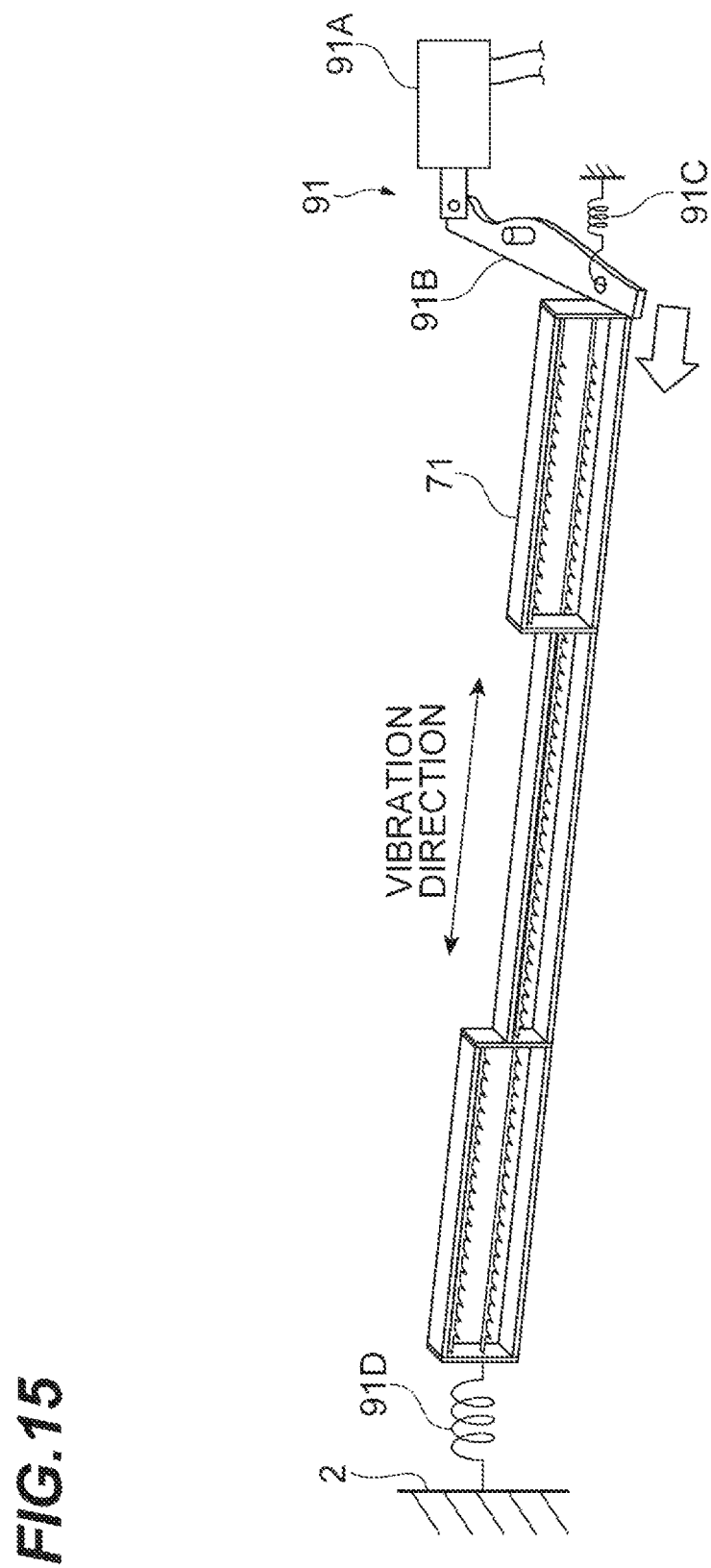
FIG. 15 is a schematic diagram of an example of a charging-device cleaning device of a cleaning device for an example imaging apparatus.

An example charging-device cleaning device 91 illustrated in FIG. 15 may be located adjacent a wall portion of the housing 2, and may include a solenoid actuator 91A and an arm 91B. A central portion of the arm 91B may be pivotally supported by a pin. A first end of the arm 91B may be connected to the solenoid actuator 91A. A second end of the arm 91B has an inner side facing the charging device 71 and an outer side opposite the inner side. The second end of the arm 91B may be urged toward the outer side (e.g., toward a side opposite to the charging device 71, away from the wall portion of the housing 2 illustrated in FIG. 15) by a stretchable elastic member 91C such as a coil spring. A first end of the charging device 71 may be elastically supported to the housing 2 by a stretchable elastic member 91D such as a coil spring, and a second end of the charging device 71 may be in contact with the second end of the arm 91B. Accordingly, when power may be supplied to the solenoid actuator 91A, the solenoid actuator 91A presses against the charging device 71 via the arm 91B. When power supply to the solenoid actuator 91A may be stopped or cut, the solenoid actuator 91A may be released, and thus the charging device 71 may be returned to an initial position, by an elastic force of the stretchable elastic member 91C and the stretchable elastic member 91D. The charging device 71 may be vibrated accordingly, to remove the fine particles 5 from the charging device 71.

Figure 16:
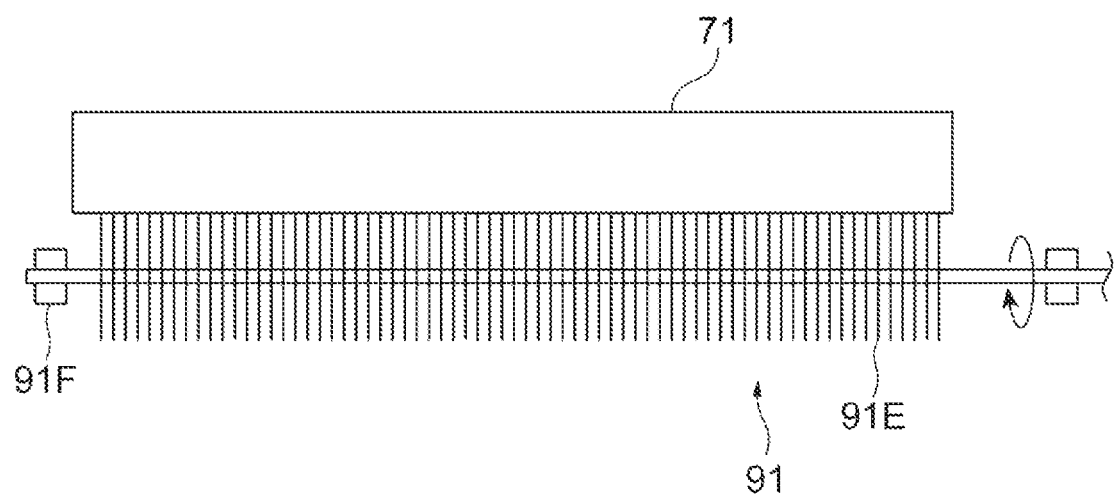
FIG. 16 is a schematic diagram of another example charging-device cleaning device.

An example charging-device cleaning device 91 illustrated in FIG. 16 may include a rotary brush 91E. The rotary brush 91E contacts the charging device 71 and may be rotated by a drive device such as a motor to physically (mechanically) remove the fine particles 5 from the charging device 71. The charging-device cleaning device 91 may include an actuator (or movement mechanism) 91F configured to move the rotary brush 91E. The actuator 91F may be configured to move the rotary brush 91E to another location when the charging device 71 is not cleaned.

Figure 17:
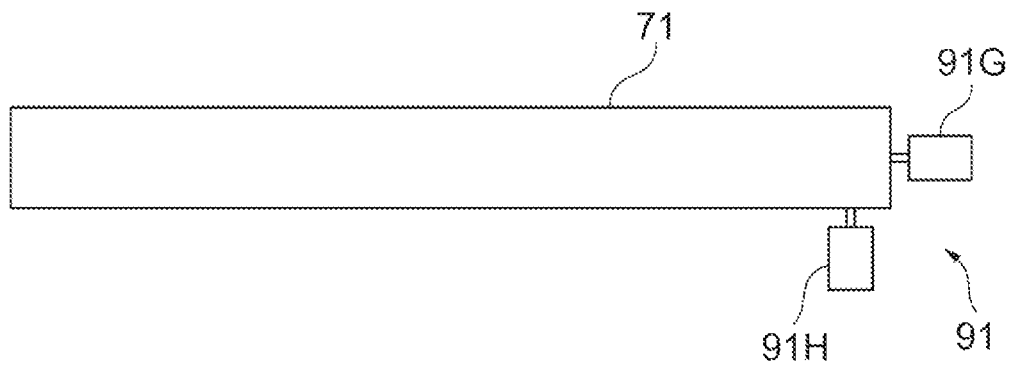
FIG. 17 is a schematic diagram of another example charging-device cleaning device.

An example charging-device cleaning device 91 illustrated in FIG. 17 may include a first vibration device 91G and a second vibration device 91H. The first vibration device 91G and the second vibration device 91H are configured to directly apply vibration, shock, ultrasonic waves, or shock waves to the charging device 71. The fine particles 5 can be removed from the charging device 71 by applying vibration or the like to the charging device 71 via the first vibration device 91G and the second vibration device 91H. The first vibration device 91G and the second vibration device 91H may apply vibrations or the like in directions different from one another in some examples, or in the same direction in other examples. In yet other examples, a single one of the first vibration device 91G and the second vibration device 91H may be provided.

Figure 18:
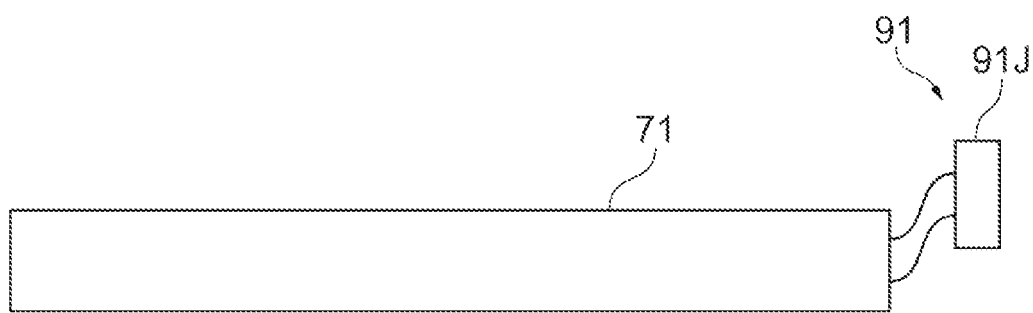
FIG. 18 is a schematic diagram of another example charging-device cleaning device.

An example charging-device cleaning device 91 illustrated in FIG. 18 may include a current control unit (or current controller) 91J. The current control unit 91J may be configured to apply a reverse voltage or pulse to the charging device 71. The fine particles 5 adhered to the charging device 71 are charged to a polarity opposite to that of the charging device 71, so as to remove the fine particles 5 from the charging device 71 by applying the reverse voltage or pulse to the charging device 71.

Referring back to FIG. 2, the filter cleaning device 92 of the cleaning device 90 may be configured to clean the filter 72. According to examples, the filter cleaning device 92 may clean the filter 72 by applying vibration, shock, ultrasonic waves, shock waves, and the like to the filter 72, or in other examples by applying physical (or mechanical) force, such as brushing (e.g., removal by a brush).

Figure 19:
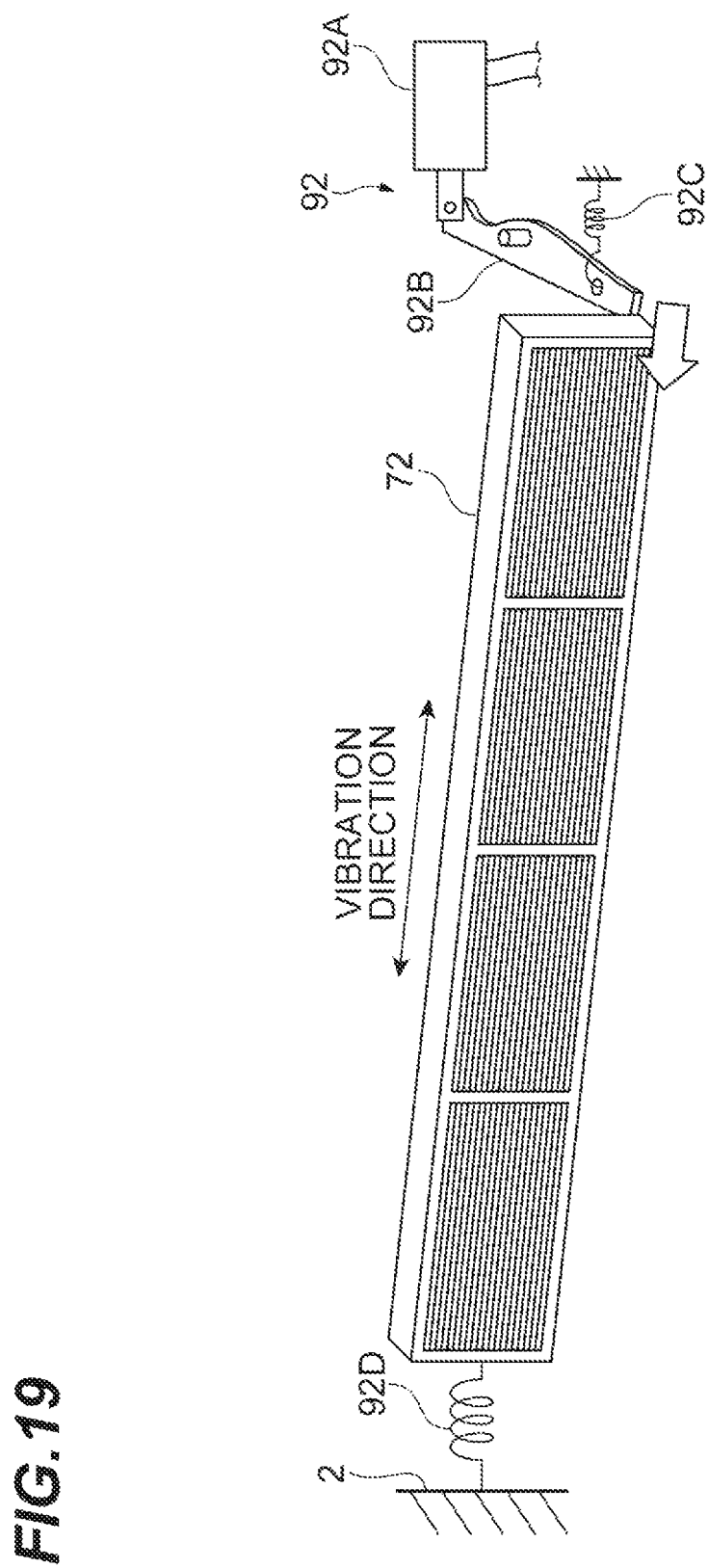
FIG. 19 is a schematic diagram of an example filter cleaning device of a cleaning device in an example imaging apparatus.

An example filter cleaning device 92 illustrated in FIG. 19 may be located adjacent a housing 2, and may include a solenoid actuator 92A and an arm 92B. A central portion of the arm 92B may be pivotally supported by a pin. A first end of the arm 92B may be connected to the solenoid actuator 92A. A second end of the arm 92B has an inner side facing the filter 72, and an outer side opposite the inner side. The second end of the arm 9B may be urged toward the outer side (e.g., toward to a side opposite to the filter 72, away from the wall portion of the housing 2 illustrated in FIG. 19), by a stretchable elastic member 92C such as a coil spring. A first end of the filter 72 may be elastically supported to the housing 2 by a stretchable elastic member 92D such as a coil spring, and a second end of the filter 72 may be in contact with the second end of the arm 92B. When power is supplied to the solenoid actuator 92A, the solenoid actuator 92A presses against the filter 72 via the arm 92B. When power supply to the solenoid actuator 92A may be stopped (or cut), the solenoid actuator 92A may be released, and the filter 72 may be returned to an initial position, by an elastic force of the stretchable elastic member 92C and the stretchable elastic member 92D. Accordingly, the filter 72 may be vibrated, to remove the fine particles 5 from the filter 72.

Figure 20:
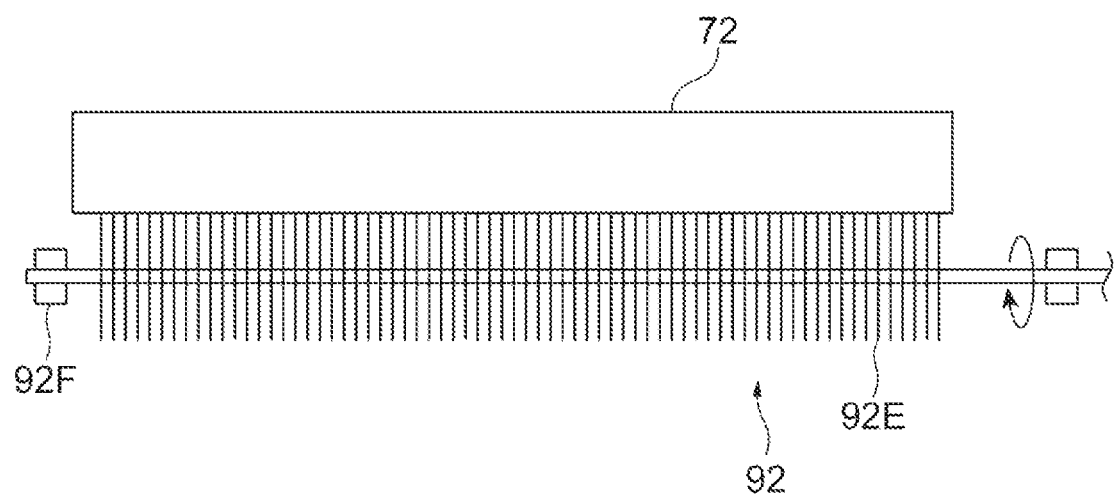
FIG. 20 is a schematic diagram of another example filter cleaning device.

An example filter cleaning device 92 illustrated in FIG. 20 may include a rotary brush 92E. The rotary brush 92E contacts the filter 72 and may be rotated by a drive device such as a motor to physically remove the fine particles 5 from the filter 72. The filter cleaning device 92 may include an actuator (or movement mechanism) 92F configured to rotate the rotary brush 92E. The actuator 92F may be configured to move the rotary brush 92E to another location (e.g., spaced away from the filter 72), when the filter 72 is not to be cleaned.

Figure 21:
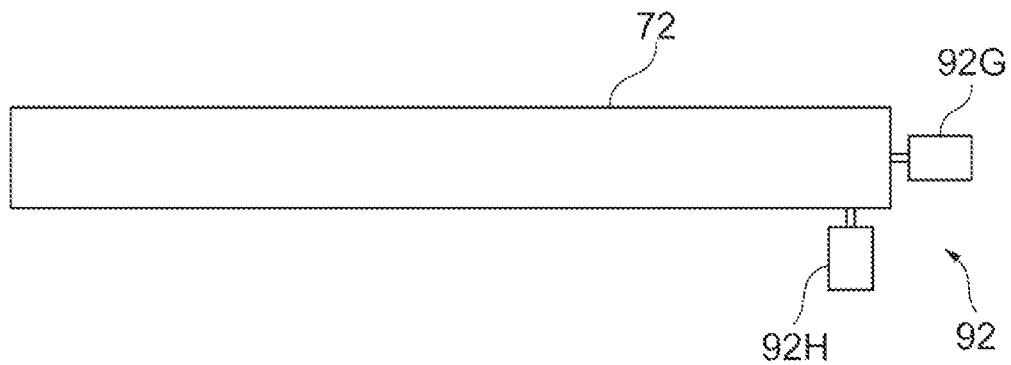
FIG. 21 is a schematic diagram of another example filter cleaning device.

An example filter cleaning device 92 illustrated in FIG. 21 may include a first vibration device 92G and a second vibration device 92H. The first vibration device 92G and the second vibration device 92H are configured to directly apply vibration, shock, ultrasonic waves, or shock waves to the filter 72. The fine particles 5 can be removed from the filter 72 by applying vibration or the like to the filter 72 via the first vibration device 92G and the second vibration device 92H. The first vibration device 92G and the second vibration device 92H may apply vibration or the like in directions different from each other according to some examples, or in the same direction in other examples. In addition, a single one of the first vibration device 92G and the second vibration device 92H may be provided.

Referring back to FIG. 2, the cleaning control unit 100 may be electrically connected to the collection device 70 and the detection device 80, and performs drive control for the collection device 70 based on the collection performance measured by the detection device 80. In some examples, the cleaning control unit 100 may be provided by a computer including a processor such as a CPU, and a storage unit (or storage device) such as a ROM or a RAM. The cleaning control unit 100 may be a control unit of the imaging apparatus 1 or the like for performing the above-described print process.

In some examples, the cleaning control unit 100 compares the collection performance (or collection performance information) detected by the detection device 80 and threshold performance (e.g., a threshold performance value) that may be set in advance. The threshold performance may be set to correspond to a value set according to an environmental certification organization of a country or region, such as the Blue Angel Mark in Germany, for example. In some examples, the threshold performance may be stored in a storage unit (or storage) of the cleaning control unit 100. When the collection performance is less than the threshold performance, the cleaning control unit 100 performs drive control for the cleaning device 90 to operate.

Figure 22:
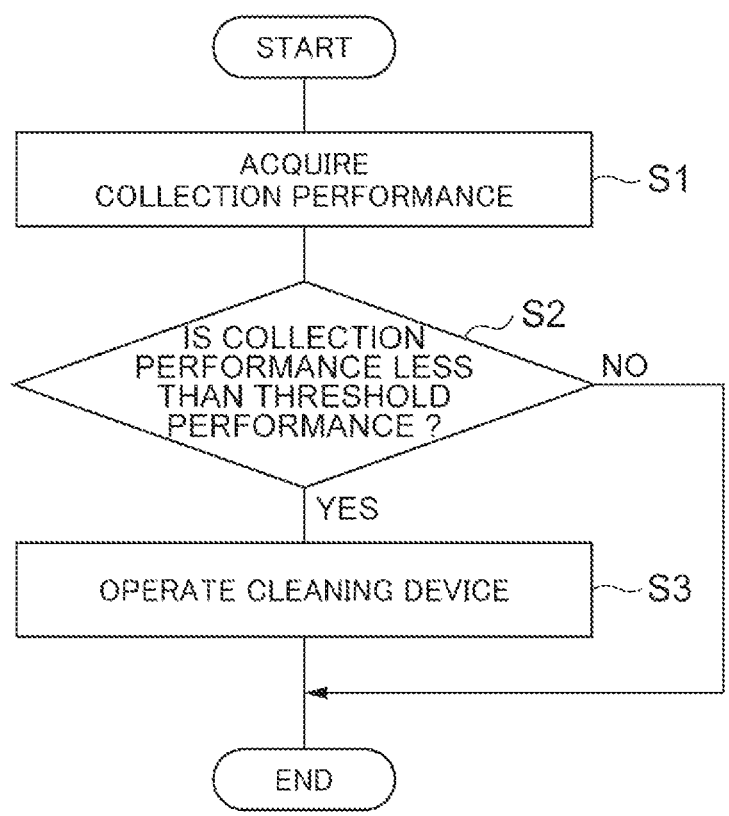
FIG. 22 is a flowchart illustrating an example control processing carried out by an example cleaning controller.

An example of control processing by the cleaning control unit 100 will be described with reference to FIG. 22. At operation S1, the cleaning control unit 100 acquires collection performance detected by the detection device 80. At operation S2, the cleaning control unit 100 determines whether or not the collection performance acquired in operation S1 is less than the threshold performance that may be set in advance. In a case where the collection performance acquired is not less than the threshold performance ("NO" of operation S2), the cleaning control unit 100 terminates the processing, and repeats the processing from operation S1. In a case where the collection performance acquired is less than the threshold performance ("YES" of operation S2), the cleaning control unit 100, at operation S3, performs drive control for the cleaning device 90 to operate S3. The cleaning control unit 100 terminates the processing, and repeats the processing again from operation S1.

Figure 23:
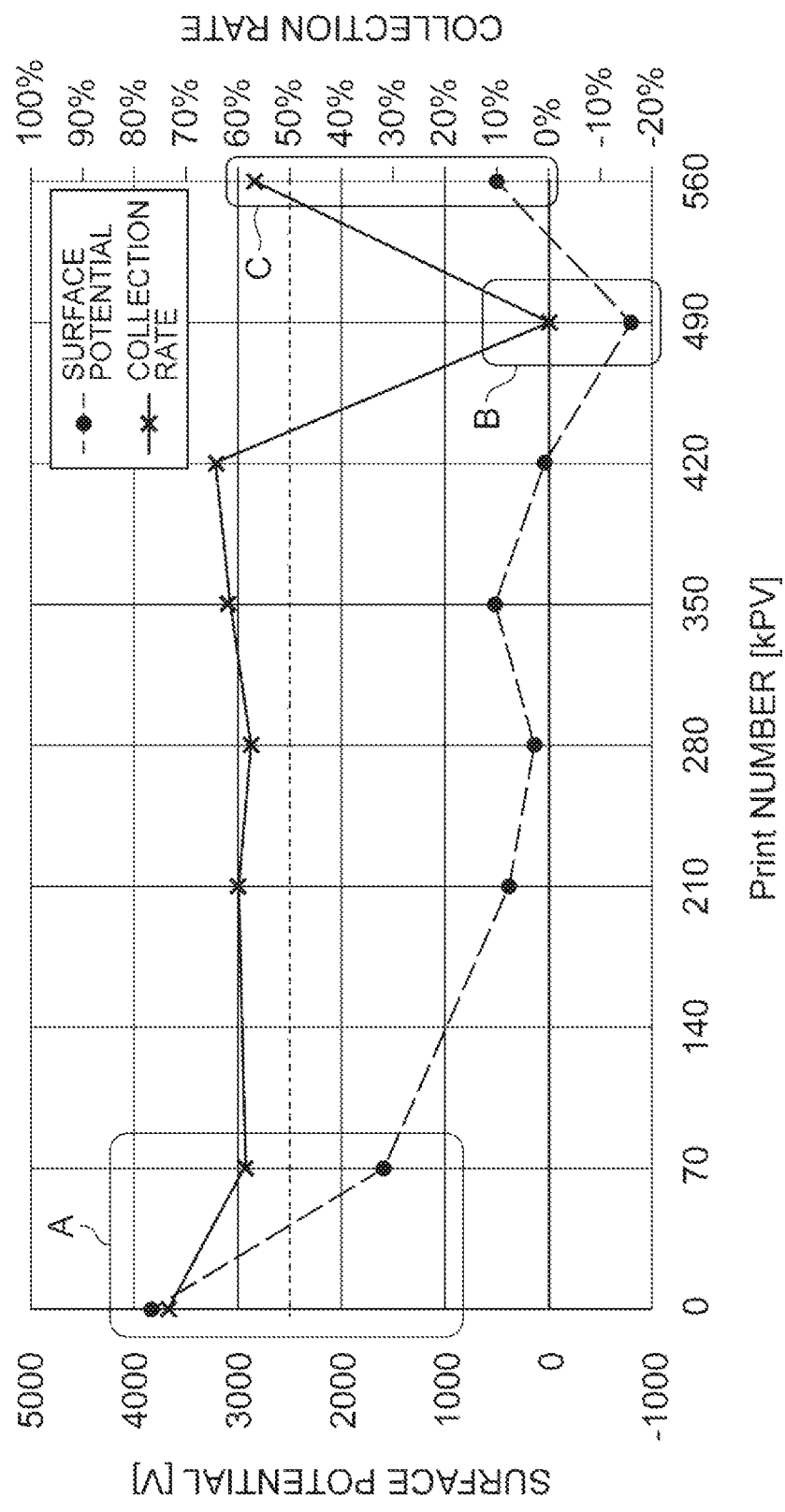
FIG. 23 is a graph of a surface potential and a collection rate relative to a number of printed sheets, in an example imaging apparatus.

FIG. 23 is a graph illustrating an example of a relationship between the number of printed sheets of the paper P by the imaging apparatus 1, a surface potential of the filter 72, and a collection rate of the fine particles 5 by the filter 72. In the example shown in FIG. 23, a region A shows that the surface potential of the filter 72 decreases from print initiation due to soiling and deterioration in the filter 72 over time, but the collection rate of the fine particles 5 does not vary significantly. A region B shows an abrupt increase in the scattering of toner in the vicinity of 490 kPV, which causes soiling on the filter 72. Accordingly, the surface potential of the filter 72 decreases, and the collection rate of the fine particles 5 decreases significantly. At this time, the cleaning control unit 100 determines that the collection performance is less than the threshold performance, and performs drive control for the cleaning device 90 to operate. Accordingly, as shown in a region C, the surface potential of the filter 72 may be recovered, and the collection rate of the fine particles 5 may be also recovered.

As described above, the detection device 80 may detect the collection performance of the collection device 70, and the cleaning device 90 may clean the collection device 70 based on the collection performance of the collection device 70, so as to suppress or inhibit a significant decrease in the collection performance of the collection device 70. When the collection performance is less than the threshold performance, the cleaning control unit 100 operates the cleaning device 90, to more efficiently clean the collection device 70.

In some examples, the soiling of the filter 72 may be measured by the detection device 80, in order to suitably detect a decrease in the collection performance which may be caused by the soiling of the filter 72. In addition, the detection device 80 may include the optical sensor 83 that detects light reflected from the filter 72, in order to measure the soiling of the filter 72.

In some examples, the recess 72E may be formed in the filter 72, and the detection surface 72F that may be a detection target for the optical sensor 83 may be formed in the recess 72E, in order to measure the soiling of the filter 72 at various positions. For example, the detection surface 72F may be located at a position where the filter 72 is likely to be soiled, measure the soiling of the filter 72 more accurately.

In some examples, the protrusion 72G may be formed in the filter 72, and the detection surface 72H that may be a detection target for the optical sensor 83 may be formed in the protrusion 72G in order to measure the soiling of the filter 72 at various positions. For example, the detection surface 72H may be set at a position where the filter 72 is likely to be soiled, in order measure the soiling of the filter 72 more accurately.

In some examples, the electric characteristics of the charging device 71 which vary due to the soiling of the charging device 71 are measured by the detection device 80, in order to more easily measure the soiling of the charging device 71, and to suitably detect a decrease in the collection performance caused by the soiling of the charging device 71.

In some examples, the filter cleaning device 92 of the cleaning device applies a vibration to the filter 72, in order to suitably remove the soiling from the filter 72, and to recover the collection performance.

In some examples, the charging-device cleaning device 91 of the cleaning device 90 applies a vibration to the charging device 71, in order to suitably remove the soiling from the charging device 71, and to recover the collection performance.

Figure 24:
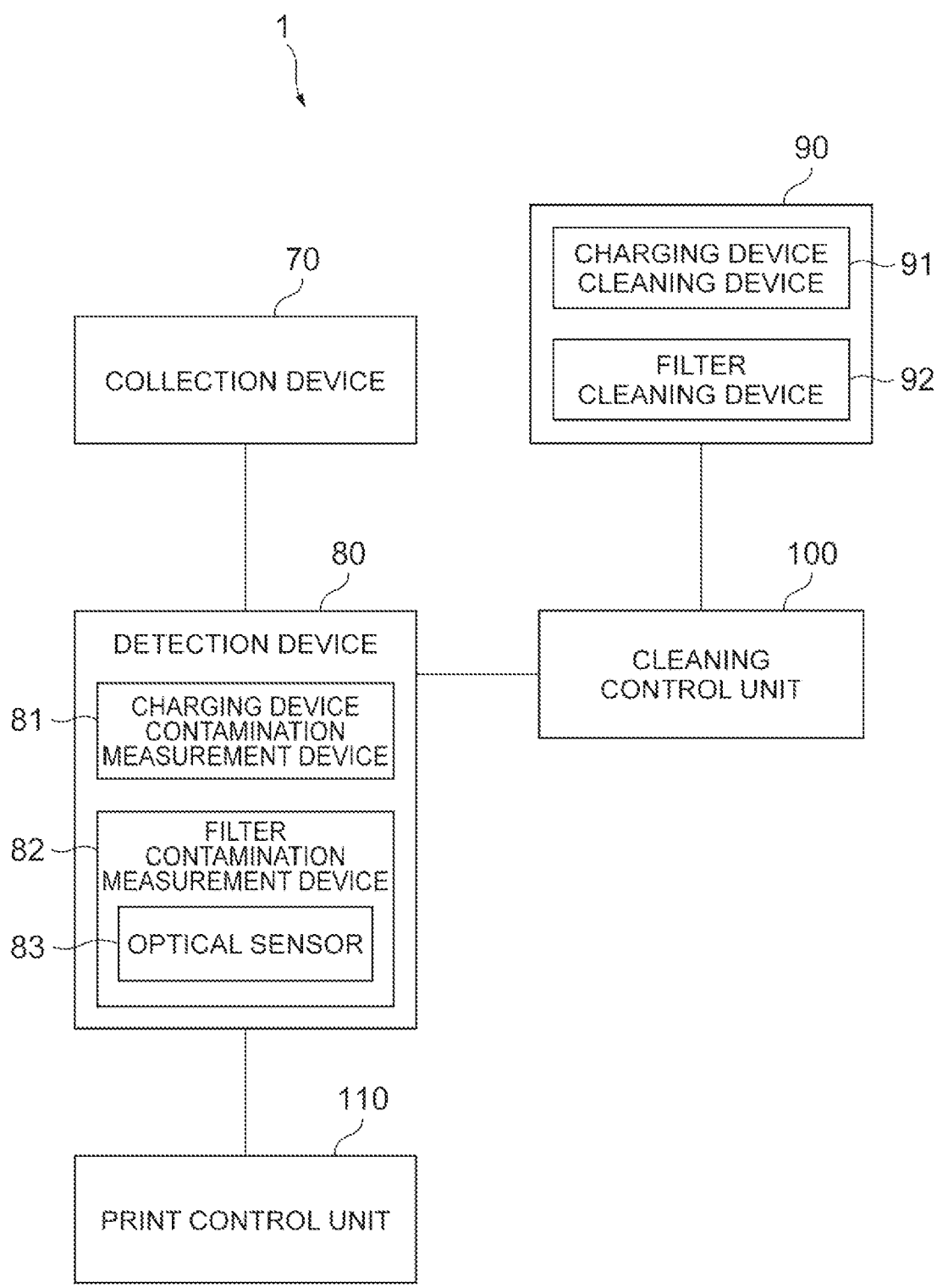
FIG. 24 is a block diagram illustrating components of another example imaging apparatus.

FIG. 24 is a block diagram schematically illustrating components of another example imaging apparatus 1. The example imaging apparatus 1 may include a collection device 70, a cleaning device 90, a cleaning control unit 100, and a print control unit (or print controller) 110. The imaging apparatus 1 may also include a detection device 80.

The print control unit 110 may be electrically connected to the detection device 80, and performs print control based on collection performance measured by the detection device 80. According to examples, the print control unit 110 may be provided by a computer including a processor such as a CPU, and a storage unit (or storage device) such as a ROM or a RAM. The print control unit 110 may be a control unit of the imaging apparatus 1 or the like for performing the above-described print process.

In some examples, the print control unit 110 compares the collection performance detected by the detection device 80 and threshold performance that may be set in advance. The threshold performance may be set to correspond to a value set by an environmental certification organization of a country or region, such as the Blue Angel Mark in Germany, for example. The threshold performance may be the same as the threshold performance that may be set as a comparison target with the collection performance by the cleaning control unit 100 described above. For example, the threshold performance may be recorded in a storage unit (or storage device) in the print control unit 110. When the collection performance is less than the threshold performance, the print control unit 110 performs print control so that a highest temperature of the fixing device 50 may be lowered. The highest temperature of the fixing device 50 may represent a temperature of a portion where the temperature of the fixing device 50 is the highest.

When the temperature of the fixing device 50 increases, a vaporization material that becomes a source of the fine particles 5 evaporates, and the fine particles 5 are generated. Accordingly, the further generation of the fine particles 5 may be promoted when the highest temperature of the fixing device 50 is increased, and generation of the fine particles 5 may be suppressed when the highest temperature of the fixing device 50 is decreased. Accordingly, the print control unit 110 performs print control so that the highest temperature of the fixing device 50 is decreased, in order to suppress or inhibit the generation of the fine particles 5.

Examples of a print control to decrease the highest temperature of the fixing device 50 may be carried out by reducing a passing speed (or conveyance speed) of the paper P through the fixing device 50, by limiting the number of continuously printed sheets, and/or by extending an interval time between print jobs.

Figure 25:
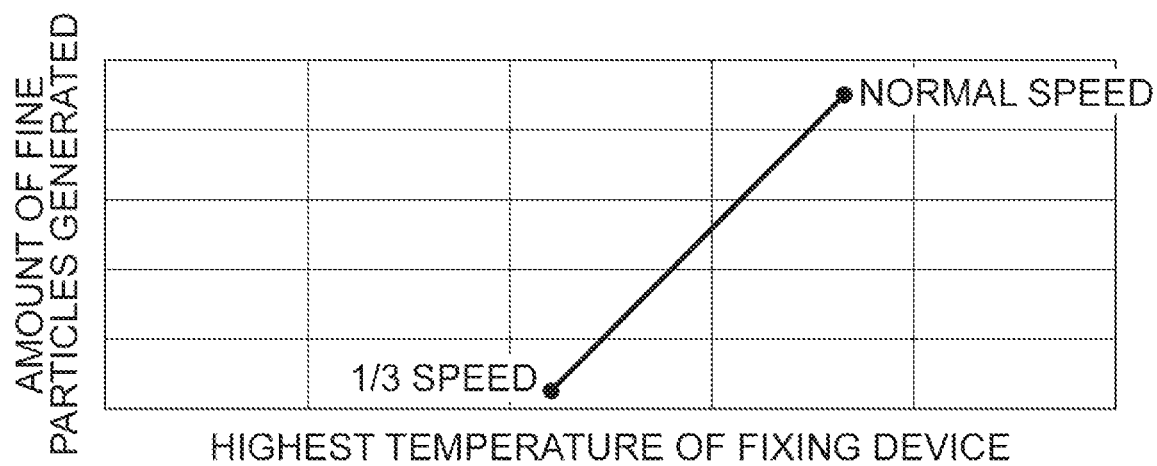
FIG. 25 is a graph an amount of fine particles generated relative to a highest temperature of a fixing device according to an example.

As shown in FIG. 25, when the passing speed of the paper P in the fixing device 50 is reduced, the highest temperature of the fixing device 50 decreases. In FIG. 25, "normal speed" represents a case where the paper P passes through the fixing device 50 at a normal speed, and "⅓ speed" represents a case where the paper P passes through the fixing device 50 at a speed ⅓ the normal speed. Accordingly, when the passing speed of the paper P in the fixing device 50 is set to be slower, the highest temperature of the fixing device 50 is decreased, so as to reduce the amount of the fine particles 5 generated.

In addition, as the continuous print is performed, temperature rising in the fixing device 50 increases. Accordingly, the number of continuously printed sheets may be limited, to decrease the highest temperature of the fixing device 50, in order to reduce the amount of the fine particles 5 generated.

In addition, as the interval between print jobs is shortened, the subsequent print job is performed before the temperature of the fixing device 50 is sufficiently lowered, and thus temperature rising in the fixing device 50 may increase. Accordingly, the interval time between print jobs may be extended, to decrease the highest temperature of the fixing device 50, and thereby to reduce the amount of the fine particles 5 generated.

Figure 26:
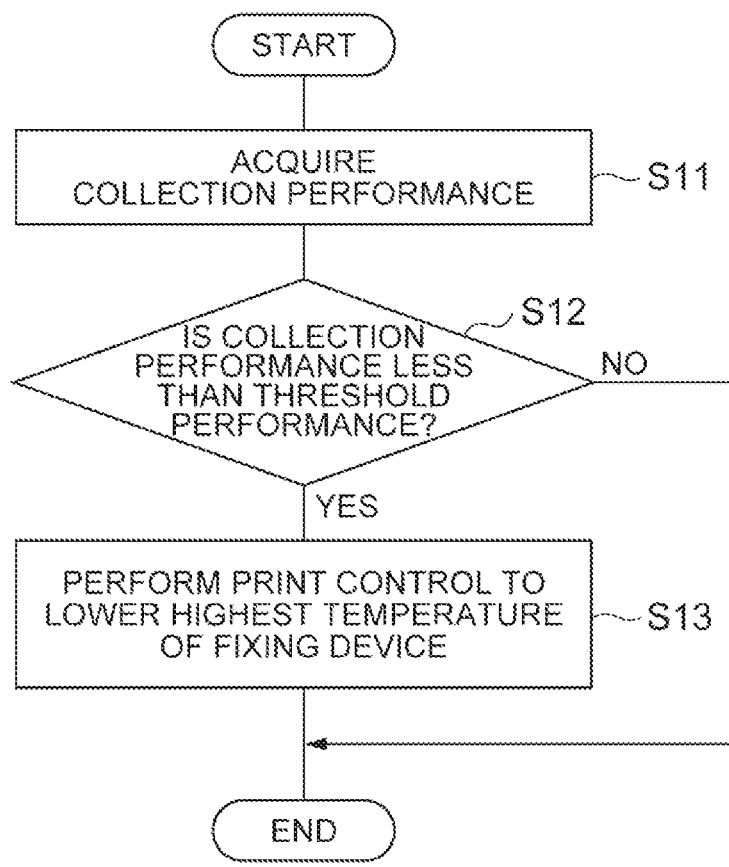
FIG. 26 is a flowchart illustrating an example control processing carried out by a print controller.

An example of control processing by the print control unit 110 will be described with reference to FIG. 26. At operation S11, the print control unit 110 acquires collection performance detected by the detection device 80. At operation S12, the print control unit 110 determines whether or not the collection performance acquired is less than the threshold performance that is set in advance. In a case where the collection performance acquired is not less than the threshold performance ("NO" of operation S12), the print control unit 110 terminates the processing, and repeats the processing from operation S11. In a case where the collection performance acquired is less than the threshold performance ("YES" of operation S12), the print control unit 110 performs at operation S13, a print control so that the highest temperature of the fixing device 50 is decreased. The print control unit 110 terminates the processing, and repeats the processing again from operation S11.

Figure 27:
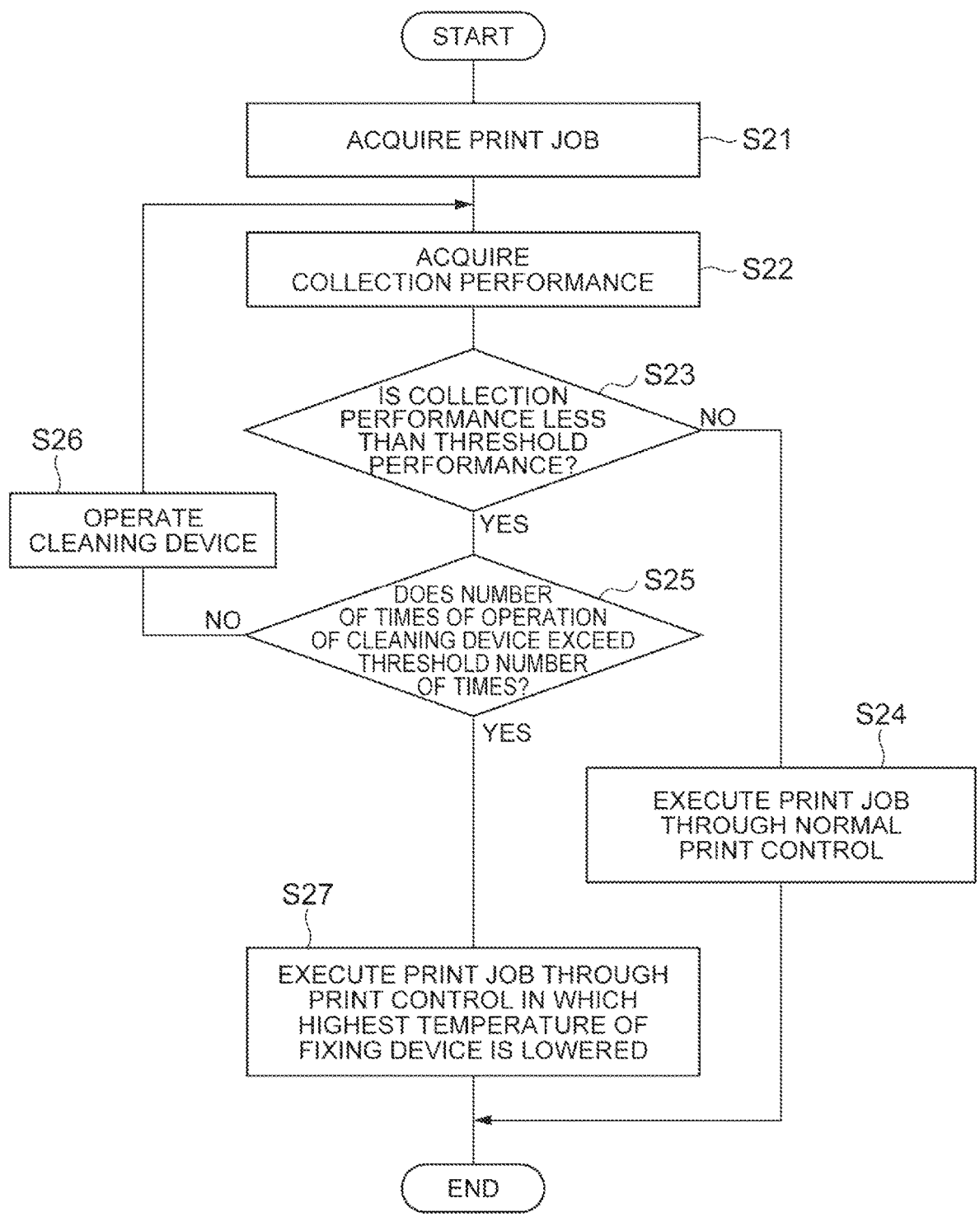
FIG. 27 is a flowchart illustrating an example control processing carried out by the cleaning controller and the print controller.

Another example of the control processing by the cleaning control unit 100 and the print control unit 110 will be described with reference to FIG. 27. At operation S21, the print control unit 110 acquires a print job. At operation S22, at least one of the cleaning control unit 100 and the print control unit 110 acquires the collection performance detected by the detection device 80. At operation S23, at least one of the cleaning control unit 100 and the print control unit 110 determines whether or not the collection performance acquired is less than the threshold performance that is set in advance. In a case where the collection performance acquired is not less than the threshold performance ("NO" of operation S23), the cleaning control unit 100 executes the print job through a normal print control. In addition, the cleaning control unit 100 and the print control unit 110 terminate the processing, and repeat the processing again from operation S21. In a case where the collection performance acquired is less than the threshold performance ("YES" of operation S22), at least one of the cleaning control unit 100 and the print control unit 110 determines, at operation S25, whether or not the number of times of operation of the cleaning device 90 exceeds a threshold number of times of operation that is set in advance. In a case where the number of times of operation of the cleaning device 90 does not exceed the threshold number of times set in advance ("NO" of operation S25), the cleaning control unit 100 performs, at operation S26, a drive control for the cleaning device 90 to operate. In addition, the process returns to operation S22. In a case where the number of times of operation of the cleaning device 90 exceeds the threshold number of times ("YES" of operation S25), the print control unit 110 executes, at operation S27, a print job through a print control in which the highest temperature of the fixing device 50 is decreased. In addition, the cleaning control unit 100 and the print control unit 110 terminate the processing, and repeat the processing again from operation S21.

As described above, the print control unit 110 performs the print control so that the highest temperature of the fixing device 50 is lowered in a case where the collection performance is less than the threshold performance, in order to suppress generation of the fine particles 5. Accordingly, for example, even in a case where the collection device 70 is not sufficiently cleaned even when the cleaning device 90 may be operated, the generation of the fine particles 5 may be suppressed or inhibited, thereby inhibiting the fine particles 5 from being discharged from the housing 2.

Figure 28:
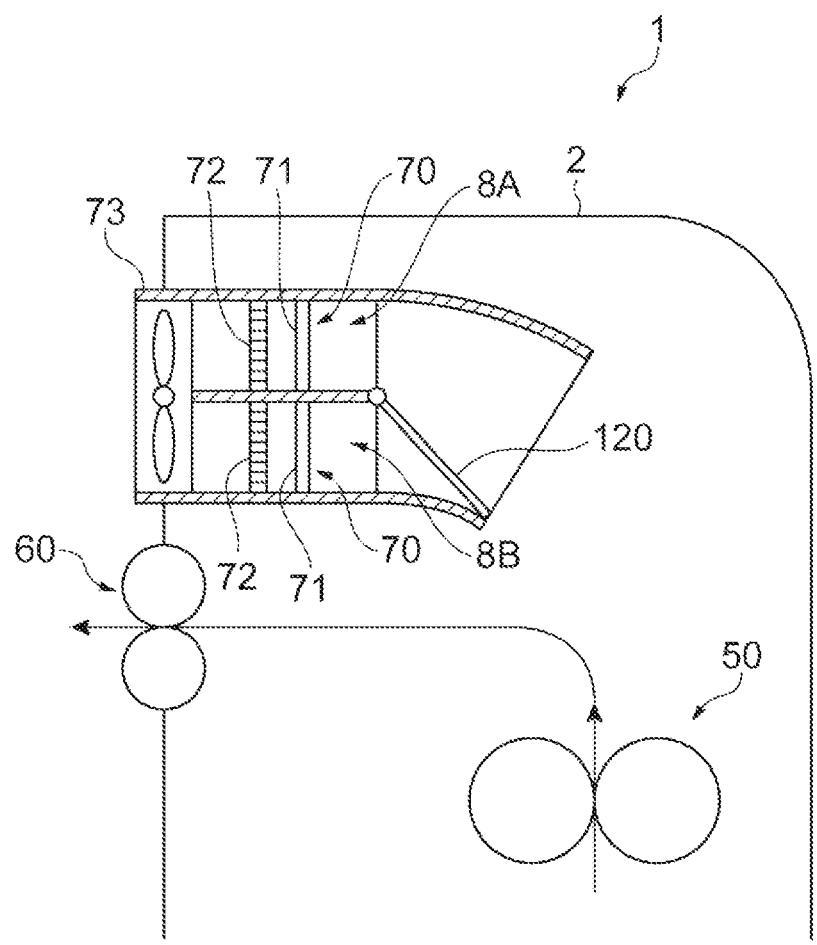
FIG. 28 is a schematic diagram illustrating components of an example imaging apparatus, forming an air flow passage.

FIG. 28 is a schematic view illustrating a part of another example imaging apparatus 1. The example imaging apparatus 1 may include a first air flow passage 8A and a second air flow passage 8B as an air flow passage that communicates with the inside and the outside of the housing 2. In addition, the imaging apparatus 1 may include a switching device (or switch) 130 that switches the air flow passage, which communicates with the inside and the outside of the housing 2, between the first air flow passage 8A and the second air flow passage 8B. In addition, the collection device 70, the detection device 80, and the cleaning device 90 may be disposed in each of the first air flow passage 8A and the second air flow passage 8B. In some examples, the switching device 130 may include a valve body that can selectively close the first air flow passage 8A and the second air flow passage 8B, and a control unit (or controller) that performs drive control for the valve body. The control unit may be provided by a control unit of the imaging apparatus 1 or the like for performing the above-described print process.

Figure 29:
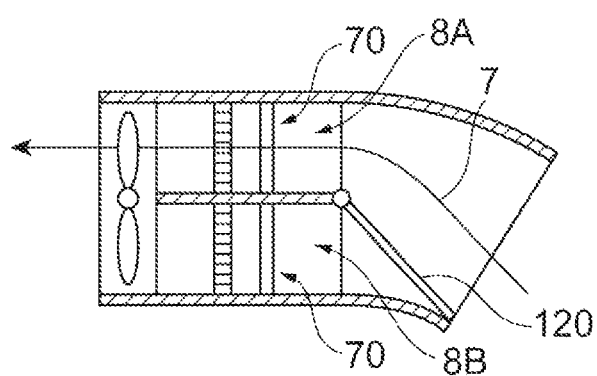
FIG. 29 is a schematic diagram illustrating a first state of the air flow passage illustrated in FIG. 28, according to an example.
Figure 30:
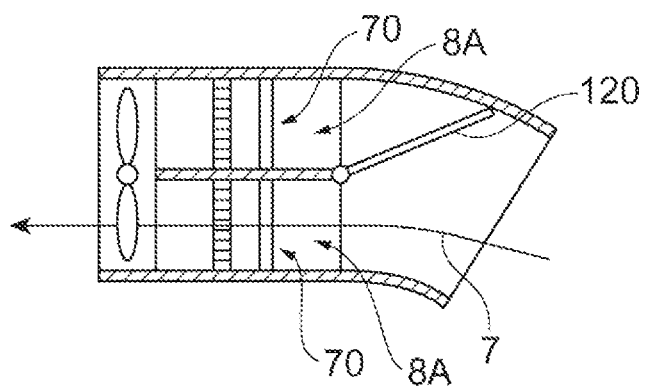
FIG. 30 is a schematic diagram illustrating a second state of the air flow passage illustrated in FIG. 28, according to an example.

FIG. 29 illustrates a first state in which the first air flow passage 8A may be set as the air flow passage that communicates with the inside and the outside of the housing 2, and FIG. 30 illustrates a second state in which the second air flow passage 8B may be set as the air flow passage that communicates with the inside and the outside of the housing 2.

In the case of the first state (FIG. 29), when the collection performance of the collection device 70 disposed in the first air flow passage 8A is less than the threshold performance, the switching device 130 switches the air flow passage that communicates with the inside and the outside of the housing 2 from the first air flow passage 8A to the second air flow passage 8B to achieve the second state (FIG. 30). Accordingly, the air stream 7 flows from the inside of the housing 2 toward the outside of the housing 2 through the second air flow passage 8B, and thus the fine particles 5 are collected by the collection device 70 disposed in the second air flow passage 8B. In addition, the cleaning control unit 100 operates the cleaning device 90 disposed in the first air flow passage 8A to clean the collection device 70 disposed in the first air flow passage 8A.

In the case of the second state (FIG. 30), when the collection performance of the collection device 70 disposed in the second air flow passage 8B is less than the threshold performance, the switching device 130 switches the air flow passage that communicates with the inside and the outside of the housing 2 from the second air flow passage 8B to the first air flow passage 8A to enter the first state (FIG. 29). Accordingly, the air stream 7 flows from the inside of the housing 2 toward the outside of the housing 2 through the first air flow passage 8A, and thus the fine particles 5 are collected by the collection device 70 disposed in the first air flow passage 8A. In addition, the cleaning control unit 100 operates the cleaning device 90 disposed in the second air flow passage 8B to clean the collection device 70 disposed in the second air flow passage 8B.

As described above, the first air flow passage 8A and the second air flow passage 8B are provided, and the air flow passage that communicates with the inside and the outside of the housing 2 may be switched between the first air flow passage 8A and the second air flow passage 8B by the switching device 130. Accordingly, the collection of the fine particles 5 by the collection device 70 and cleaning of the collection device 70 may be switched between the first air flow passage 8A and the second air flow passage 8B. Accordingly, it is possible to continuously operate the collection device 70 with a high collection efficiency.

It is to be understood that not all aspects, advantages and features described herein may necessarily be achieved by, or included in, any one particular example. Indeed, having described and illustrated various examples herein, it should be apparent that other examples may be modified in arrangement and detail is omitted.

For example, even in a case where the collection performance is not less than the threshold performance, the cleaning control unit may operate the cleaning device 90 based on information of a print job. For example, the cleaning control unit may operate the cleaning device 90 between print jobs to remove the fine particles 5 at a stage in which a relatively small amount of fine particles 5 are adhered to the collection device 70. In this case, the cleaning power of the cleaning device on the collection device 70 may be reduced. For example, in a case where the cleaning device 9 vibrates the charging device 71 or the filter 72 as illustrated in FIG. 15 or FIG. 19, the charging device 71 or the filter 72 may be vibrated less in comparison to a state where the collection performance is less than the threshold performance. In addition, for example, the cleaning control unit may predict a timing at which an ozone concentration increases due to adhesion of the fine particles 5 based on information such as a printing rate, the number of printed sheets, and time of integrated use, and may operate the cleaning device 90 at that timing. In this case, cleaning power of the cleaning device 90 on the collection device 70 may be greater than in the case of operating the cleaning device 90 between print jobs.

The invention claimed is:

1. An imaging system comprising:
   a housing to define a housing space;
   a collection device to collect fine particles in the housing space, wherein the collection device includes a charging device and a filter downstream of the charging device in a direction of an air flow passage that directs a portion of the fine particles to collect as a soiling on the charging device;
   a detection device to detect a collection performance of the collection device based in part on a measurement of the soiling on the charging device; and
   a cleaning device to clean the collection device based on the collection performance.

2. The imaging system according to claim 1,
   wherein the collection device includes the charging device to charge the fine particles and the filter to collect the fine particles having been charged, wherein the fine particles collected form a soiling on the filter, and
   wherein the detection device includes a filter soiling measurement device to measure the soiling on the filter and to detect the collection performance based on the soiling measured.

3. The imaging system according to claim 2,
   wherein the filter soiling measurement device includes an optical sensor to detect light reflected from the filter so as to measure the soiling based on the light reflected.

4. The imaging system according to claim 3,
   wherein the charging device and the filter are aligned along the air flow passage to carry the fine particles to the filter, and
   wherein the optical sensor is adjacent the air flow passage.

5. The imaging system according to claim 4,
   wherein the filter includes a detection surface located in the air flow passage, and
   the optical sensor to detect light reflected from the detection surface.

6. The imaging system according to claim 5,
wherein the filter includes a recess that extends in a direction of the air flow passage, and
wherein the detection surface is in the recess.

7. The imaging system according to claim 5,
wherein the filter includes a main body and a protrusion that extends from the main body to form the detection surface.

8. The imaging system according to claim 2,
wherein the cleaning device includes a filter cleaning device to impart a vibration to the filter of the collection device.

9. The imaging system according to claim 2,
wherein the cleaning device includes a charging-device cleaning device to impart a vibration to the charging device of the collection device.

10. The imaging system according to claim 1, further comprising a charging-device soiling measurement device,
wherein the charging device comprises electric characteristics that are variable in accordance with the soiling formed, and
the charging-device soiling measurement device to measure the electric characteristics of the charging device, to detect the soiling formed on the charging device.

11. The imaging system according to claim 1, comprising:
a cleaning controller to compare the collection performance detected with a threshold performance, and to cause the cleaning device to operate when the collection performance is less than the threshold performance.

12. The imaging system according to claim 1, comprising:
a fixing device; and
a print controller to:
compare the collection performance detected with a threshold performance, and
reduce a highest temperature of the fixing device when the collection performance detected is less than the threshold performance.

13. The imaging system according to claim 1, comprising:
a first air flow passage including the collection device which is a first collection device;
a second air flow passage including a second collection device; and
a switching device to selectively switch between the first air flow passage and the second air flow passage, to form a selected air flow passage which communicates an inside of the housing with an outside of the housing, the switching device to switch to the second air flow passage, as the selected air flow passage, when the first air flow passage is set as the selected air flow passage and the collection performance of the first collection device is less than a threshold performance.

14. An imaging system comprising:
a housing to define a housing space;
a second collection device including a second filter coupled to a second air flow passage;
a switching device to selectively switch between the first air flow passage and the second air flow passage to form a selected air flow passage which communicates an inside of the housing with an outside of the housing, wherein the switching device is to switch to the second air flow passage when a collection performance of the first collection device is less than a threshold performance; and
a cleaning device to clean the first collection device.

15. An imaging system comprising:
a housing to define a housing space;
a collection device to collect fine particles in the housing space, the collection device including a charging device to charge the fine particles and a filter to collect the fine particles having been charged, wherein the fine particles collected form a soiling on the filter;
a fixing device; and
a print controller to:
compare a detected collection performance of the filter with a threshold performance for the filter; and
reduce a highest temperature of the fixing device when the detected collection performance is less than the threshold performance.

16. The imaging system according to claim 15, further comprising:
a detection device to detect a collection performance of the collection device.

17. The imaging system according to claim 16, comprising a cleaning device to clean the collection device:
wherein the cleaning device to clean the collection device based on the collection performance detected, and
the detection device includes a filter soiling measurement device to measure the soiling on the filter and to detect the collection performance based on the soiling measured.

* * * * *